US00RE37944E

(19) United States
(12) Reissued Patent
Fielder et al.

(10) Patent Number: US RE37,944 E
(45) Date of Reissued Patent: Dec. 31, 2002

(54) SINGLE CHIP FRAME BUFFER AND GRAPHICS ACCELERATOR

(75) Inventors: Dennis A. Fielder, Herts (GB); James H. Derbyshire, Rockcliffe Park (CA); Peter B. Gillingham, Kanata (CA); Randy R. Torrance, Ottawa (CA); Cormac M. O'Connell, Kanata (CA)

(73) Assignee: 3612821 Canada Inc., Kanata (CA)

(21) Appl. No.: 09/434,331

(22) Filed: Nov. 5, 1999

Related U.S. Patent Documents

Reissue of:
(64) Patent No.: 5,694,143
Issued: Dec. 2, 1997
Appl. No.: 08/253,271
Filed: Jun. 2, 1994

(51) Int. Cl.[7] ..... G06F 15/76
(52) U.S. Cl. ..... 345/519; 345/546; 345/559; 345/501
(58) Field of Search ..... 345/519, 507–509, 345/501, 502, 505, 515, 516, 513, 112, 546, 545, 559; 365/189.07, 203, 276, 230.06, 230.08

(56) References Cited

U.S. PATENT DOCUMENTS

| | | | | | |
|---|---|---|---|---|---|
| 4,646,151 | A | * | 2/1987 | Welles, II et al. | 348/513 |
| 4,691,295 | A | | 9/1987 | Erwin et al. | 345/188 |
| 4,740,782 | A | | 4/1988 | Aoki et al. | 345/205 |
| 4,918,526 | A | * | 4/1990 | Lewis et al. | 348/580 |
| 5,027,212 | A | | 6/1991 | Marlton et al. | 348/512 |
| 5,083,047 | A | | 1/1992 | Horie | 326/45 |
| 5,144,223 | A | | 9/1992 | Gillingham | 323/313 |
| 5,170,154 | A | | 12/1992 | Manlopoulos | 345/27 |
| 5,198,708 | A | | 3/1993 | Gillingham | 326/93 |
| 5,267,201 | A | | 11/1993 | Foss et al. | 365/189.09 |
| 5,283,761 | A | | 2/1994 | Gillingham | 365/189.07 |
| 5,305,283 | A | | 4/1994 | Shimokura et al. | 365/230.08 |
| 5,392,391 | A | * | 2/1995 | Caulk, Jr. et al. | 395/503 |
| 5,406,523 | A | | 4/1995 | Foss et al. | 365/226 |
| 5,414,662 | A | | 5/1995 | Foss et al. | 365/203 |
| 5,442,748 | A | | 8/1995 | Chang et al. | 345/507 |
| 5,448,733 | A | | 9/1995 | Satoh et al. | 707/100 |
| 5,469,401 | A | | 11/1995 | Gillingham | 365/230.06 |
| 5,572,655 | A | * | 11/1996 | Tuljapurkar et al. | 707/526 |
| 5,712,664 | A | * | 1/1998 | Reddy | 345/519 |

FOREIGN PATENT DOCUMENTS

| | | |
|---|---|---|
| DE | 3628286 | 2/1988 |
| EP | 0 165 441 A3 | 12/1985 |
| EP | 0 260 578 A3 | 3/1988 |
| EP | 0334524 | 9/1989 |
| EP | 0 383 080 A3 | 8/1990 |
| EP | 0 474 366 A2 | 3/1992 |
| EP | 0 492 840 A1 | 7/1992 |
| EP | 0 547 892 A3 | 6/1993 |
| GB | 2 217 066 A | 10/1987 |
| GB | 2208344 | 3/1989 |

OTHER PUBLICATIONS

"The integrated display controller (IDC) for VLSI design workstation" by Jurgen Stark, Computer & graphics vol. 11, No. 2, pp. 185–192, 1987.*

"100 Mpixel/sec single chip integrated graphics controller (IGC)" by D. Mansharamani et al, IEEE 1991 custom integrated circuits conf, 12–15 May 1991, pp. 16.5.1–16.5.4.*

(List continued on next page.)

*Primary Examiner*—Kee M. Tung
(74) *Attorney, Agent, or Firm*—Shapiro Cohen

(57) ABSTRACT

A single chip display processor comprised of a dynamic random access memory (DRAM) for storing at least one of graphics and video pixel data, a pixel data unit (PDU) for processing the pixel data, integrated in the same integrated circuit (IC) chip as the DRAM, the IC chip further comprising a massively parallel bus for transferring blocks of pixel data at the same time from the DRAM to the PDU, whereby the PDU can process the blocks of pixel data for subsequent display of processed pixel data.

26 Claims, 19 Drawing Sheets

OTHER PUBLICATIONS

Figure 1:
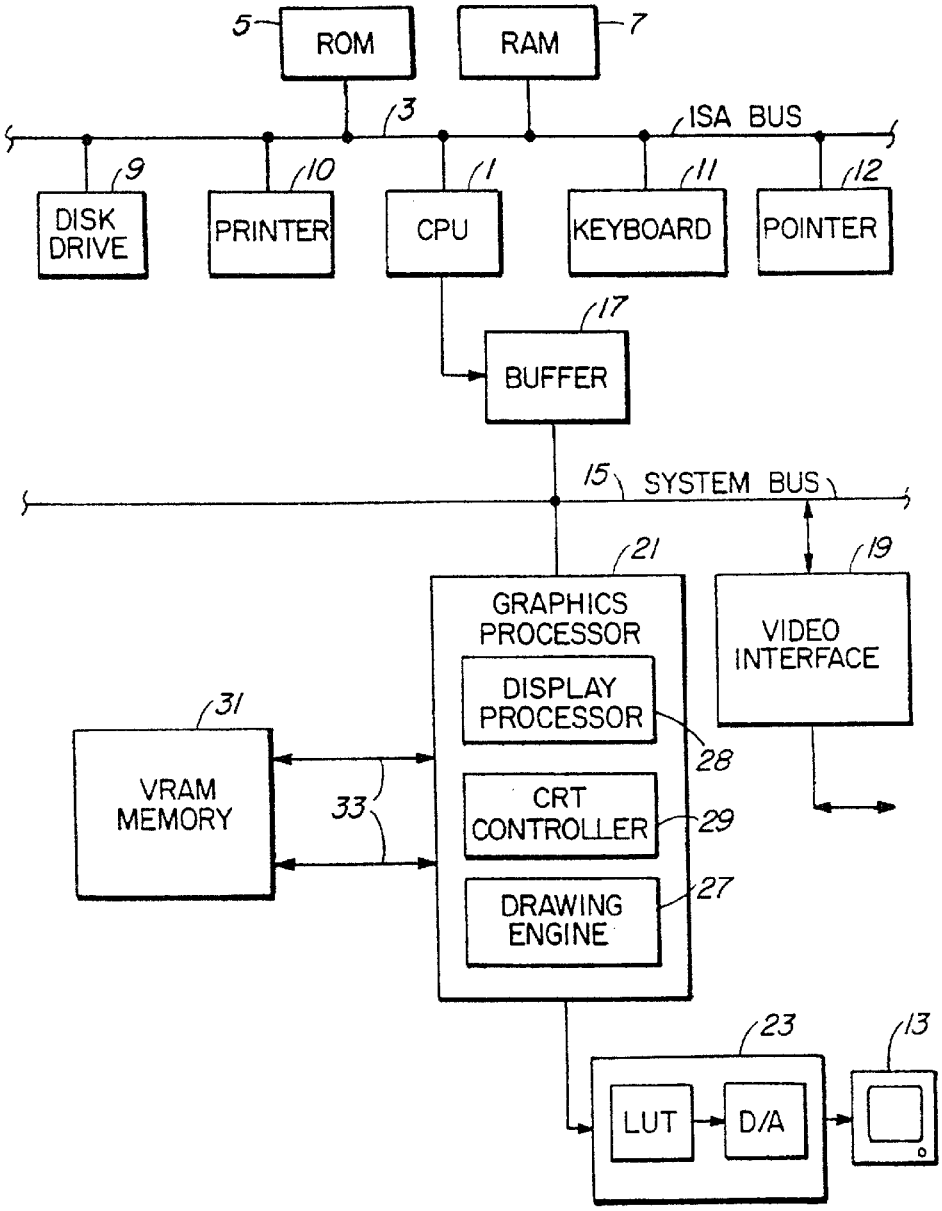
FIG. 1 PRIOR ART

NEC Research and Development, vol. 33, No. 4, Oct. 1992 Tokyo, JP, pp. 585–594 "Integrated Memory Array Processor".

IEEE Journal of Solid–State Circuits, vol. 25, No. 1, Feb. 1990 N.Y., pp. 30–35, A 50 MHz 8 Mbit Video Ram with a Column Direction Drive Sense Amplifier.

* cited by examiner

SINGLE CHIP FRAME BUFFER AND GRAPHICS ACCELERATOR

Matter enclosed in heavy brackets [ ] appears in the original patent but forms no part of this reissue specification; matter printed in italics indicates the additions made by reissue.

FIELD OF THE INVENTION

This invention relates to computer monitor display controllers for computer terminal displays that use bit-mapped memory, and in particular to a frame buffer memory system and pixel logic connected to the frame buffer memory which processes pixel data prior to application of signals derived therefrom to the computer monitor.

BACKGROUND TO THE INVENTION

As is well known, a pixel is a picture element on a computer display which has a certain color. Each logical pixel is actually formed of data defining 3 pixels, a red, green and blue pixel, each of which results in a visually merged, colored point on the display. In this disclosure, the term pixel will mean one logical pixel, that is, one set of red, green and blue elements defined by data.

A frame buffer is a memory which contains one frame of pixels, a frame being the total number of pixels that can be displayed on a display. VGA monitors have displays with a frame size of 640 by 480 pixels, and therefore a VGA frame buffer is a memory capable of holding 640×480, or 307,200 pixels.

While a pixel can be stored digitally using any number of bits, a standard "true color" display utilizes 24 bits per pixel, 8 bits for each red, green and blue color of each pixel. Another standard is 8 bits per pixel.

Many systems exist for controlling computer displays, but all systems employ separate integrated circuits for a graphics processor, a frame buffer, and pixel logical operations. The graphics processor can be a single chip or multiple chips interconnected to perform the required processing function. The frame buffer is typically made up of multiple video random access memory (VRAM) chips, or dynamic random access memory (DRAM) chips, as well as a memory controller chip. The pixel logic usually consists of some high speed logic, a high speed static random access memory (SRAM) chip, and a triple random access memory—digital to analog converter (RAMDAC) chip.

One of the critical tasks of a display controller system is to perform the graphics operations as quickly as possible. Bottlenecks determine the maximum speed of the system. One of the major bottlenecks in a graphics system is the interface throughput between the graphics processor and the frame buffer memory. The width of the bus between these two systems is proportional to the speed at which the system can process pixels (pixels per second). Most current systems have a 16 bit or a 32 bit interface, and the most powerful current system has a 64 bit interface.

Another major bottleneck is between the graphics processor and the RAMDAC. The power consumed in driving the capacitive loads of these two interfaces represents a significant fractions of overall graphics sub-system power.

SUMMARY OF THE INVENTION

The present invention substantially increases the speed of the graphical and/or video display system of a personal computer or work station, by removing the aforenoted bottleneck. It does so by providing a massively parallel bus between the memory of the display processor and the pixel processor. The data of an entire line of pixels, frame or part of a frame is thereby transferred in parallel between the memory and the pixel processor, whereby the pixel processor processes each bit in parallel with the others that have been transferred. For example, the bus, instead of a maximum 64 bits as in the prior art noted above, can be comprised of 5128 differential bus lines. To provide the massively parallel bus, the architecture of the DRAM memory of the display processor is modified. In addition, to realize the speed gain, both the memory and the display processor, as well as ancillary circuits such as control circuits, decoders, etc., are integrated together into the same integrated circuit.

With the massively parallel operation of the circuit, circuits are included in embodiments which minimize the impact of sudden and large power requirements from the system power supply, and which minimize power usage in the integrated display processor.

The RAMDAC function is also integrated on the same chip to remove the graphics controller-RAMDAC bus as a limiting factor in graphics performance.

A massively parallel bus is a bus having a number of lines which is far greater than the number of bits in a data word handled in the computer or workstation.

In the present invention the entire frame buffer system, including the memory controller, a basic pixel processor and a pixel logic system including a RAMDAC, are integrated into a single integrated circuit chip (IC). This can be implemented as a single stand-alone IC, or a graphics processor can be integrated in the same IC. The frame buffer in the present invention is implemented as a DRAM, and thus can be fabricated using a modern DRAM process (with appropriate dimensions for the size of buffer desired). The pixel processor is implemented as a block of logic circuits very tightly coupled to the DRAM frame buffer. Output pixel logic circuits are preferably implemented in high speed logic, multiple high speed SRAMs and three high speed DACs. These elements are all integrated together to form a very high speed graphics accelerator subsystem.

The invention can be used to control any display device that uses a bit-mapped pixel graphics system, such as Windows 3.1, Chicago (Windows 4) and Windows NT. As sill be understood after reading the description of the invention below, the design can support any size display. The embodiment described herein is directed to a display size of up to 1280 by 1024 pixels. This size of display can be supported using a single chip as described herein, in an eight bit per pixel mode. The embodiment described can also be used singly to support true-color (24 bits per pixel) for VGA displays of 640 by 480 pixels. A set of three of these chips can be operated in parallel to support true-color for all bit mapped screens up to 1280 by 1024 pixels.

To support a 1280 by 1024 by 8 bit frame buffer on a single chip, 10 megabits of DRAM must be integrated in the chip. When the rest of the chip is considered, it clearly must be implemented in a 16 megabit DRAM process. However, smaller versions of the chip, e.g. for support of smaller displays could be implemented using other technologies.

As noted above, the single chip graphics system utilizes a massively parallel bus, in a novel architecture. This provides an interface between the frame buffer memory and a pixel processor (a pixel data unit PDU, the basic graphics processor implementing some of the most basic, but also most often used graphics commands) to be extremely wide.

In an embodiment described herein, the interface bus is 5128 bits wide, orders of magnitude larger than the most extremely wide prior art bus (64 bits) in the most powerful previous system. The PDU is interfaced back to the remainder of the graphics processor using a 32 bit bus.

The novel architecture and novel circuits used therein also provide power saving enhancements, to avoid the massive full power dissipation which would otherwise be required in such a system wherein circuits must operate in parallel on 5128 bits in an IC.

The present invention can be used in many different modes of operation. For example, it can be used to display a single window of graphics, of any size, on the display. It can be used for any number of windows of graphics. It will allow any one of these windows to display real-time video. The invention also achieves rate conversion between various video inputs and synchronizes them to the pixel rate. It could also allow a full motion video window to cover the entire display. It will allow full-motion video to be input in a variety of different standard formats, including GREY8, RGB332, RGB565, RGB555, ARGB8888, LUT8, RGB888, YUV411, YUV422 and YUV420, as well as other formats.

A further video function is supported, that of mirroring. The video can be displayed on the display in its correct orientation, or mirrored horizontally. This allows support of a video conferencing mode, in which the user views himself mirrored.

In accordance with an embodiment of the invention, a single chip display processor is comprised of a dynamic random access memory (DRAM) for storing at least one of graphics and video pixel data, a pixel data unit (PDU) for processing the pixel data, integrated in the same integrated circuit (IC) chip as the DRAM, the IC chip further comprising a massively parallel bus for transferring blocks of pixel data at the same time from the DRAM to the PDU, whereby the PDU can process the blocks of pixel data for subsequent display of processed pixel data.

In accordance with another embodiment of the invention, a method of providing pixel data to the display system is comprised of storing pixel data in the frame buffer, transferring pixel data from a row of frame buffers in parallel via a massively parallel bus having a similar number of bus lines as pixel bits to be transferred to corresponding parallel inputs of a graphics output shift register, and serially reading the data from the shift register to display circuitry.

BRIEF INTRODUCTION TO THE DRAWINGS

Figure 2:
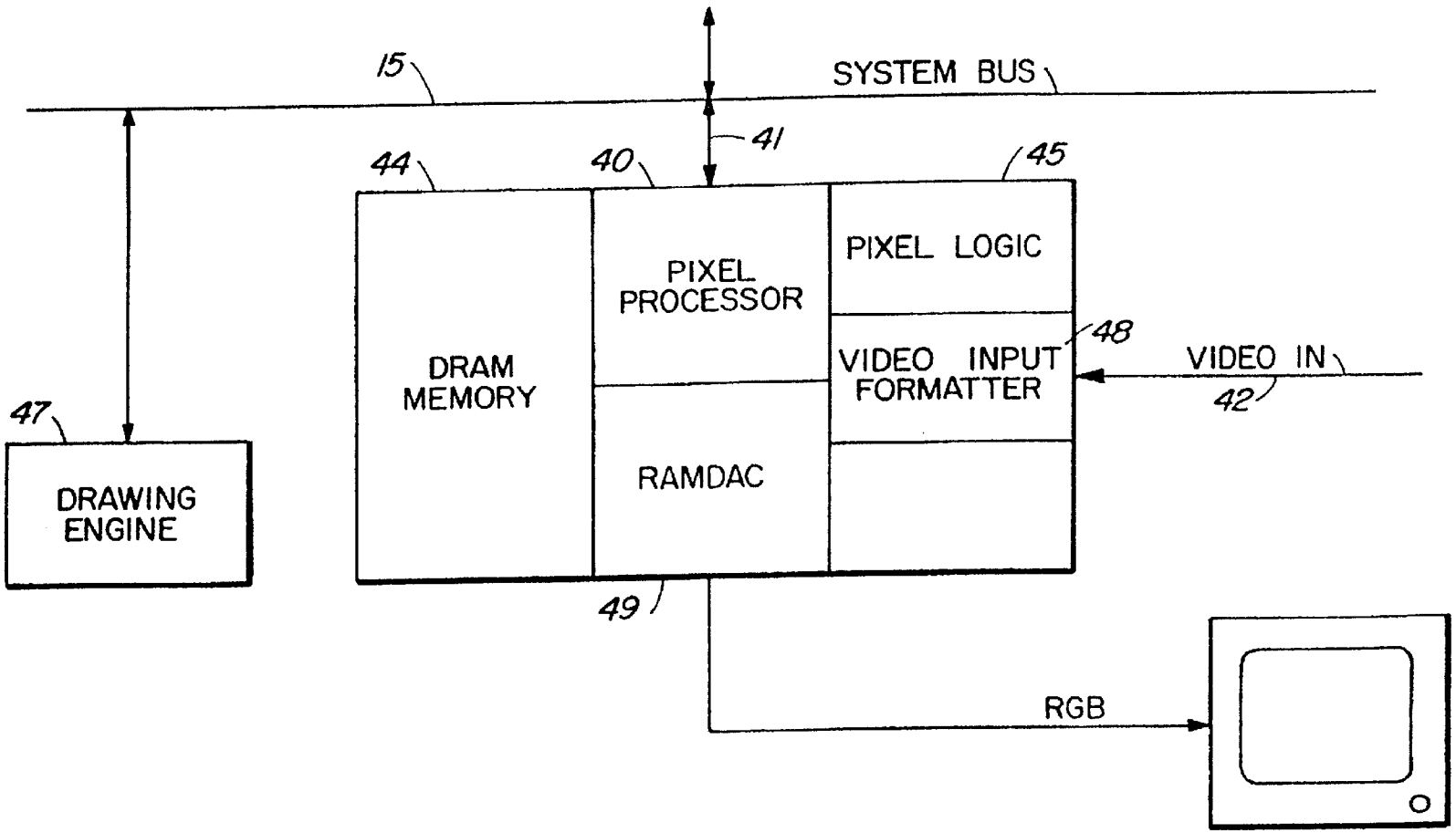
Figure 3:
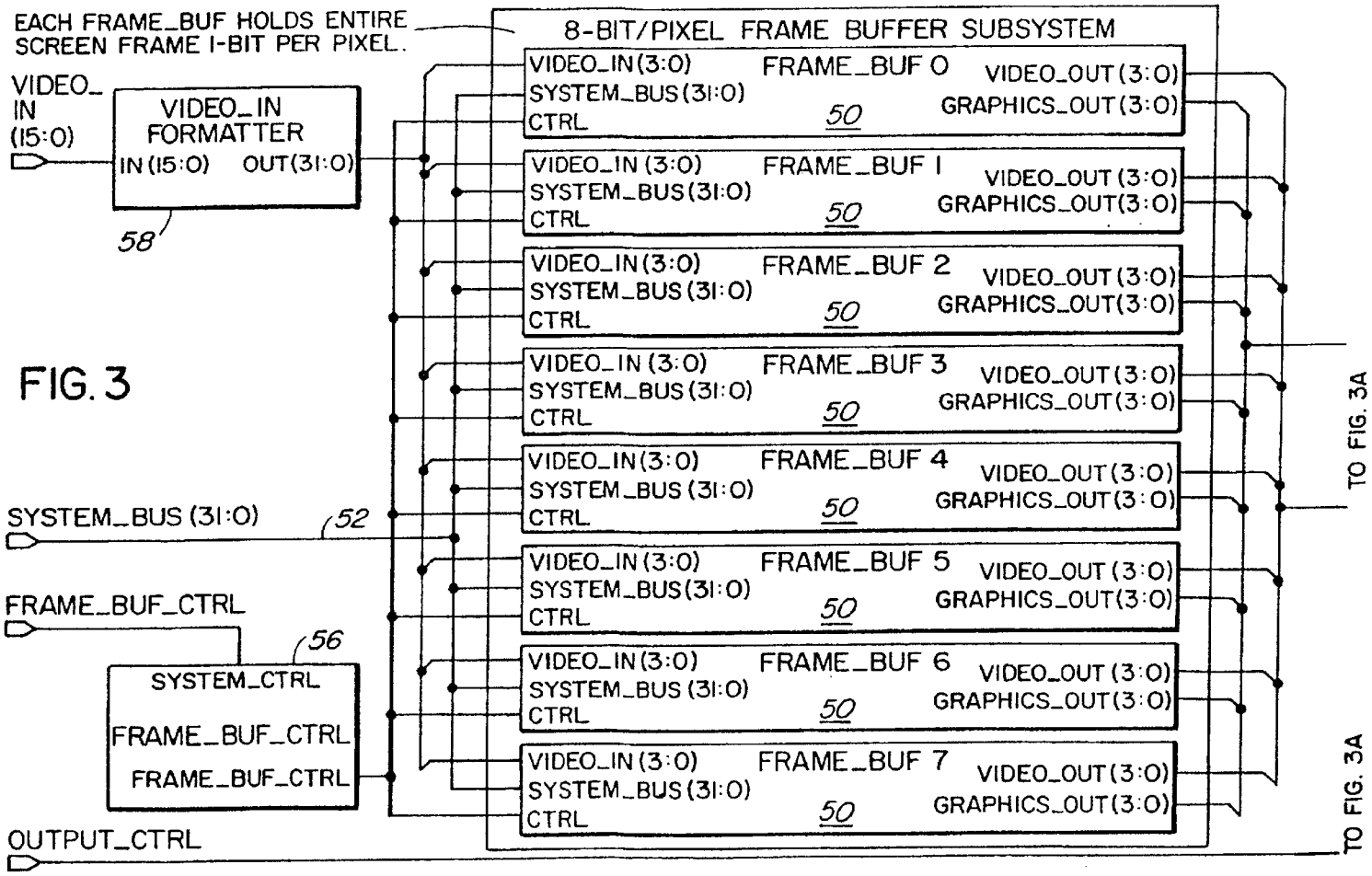
Figure 3A:
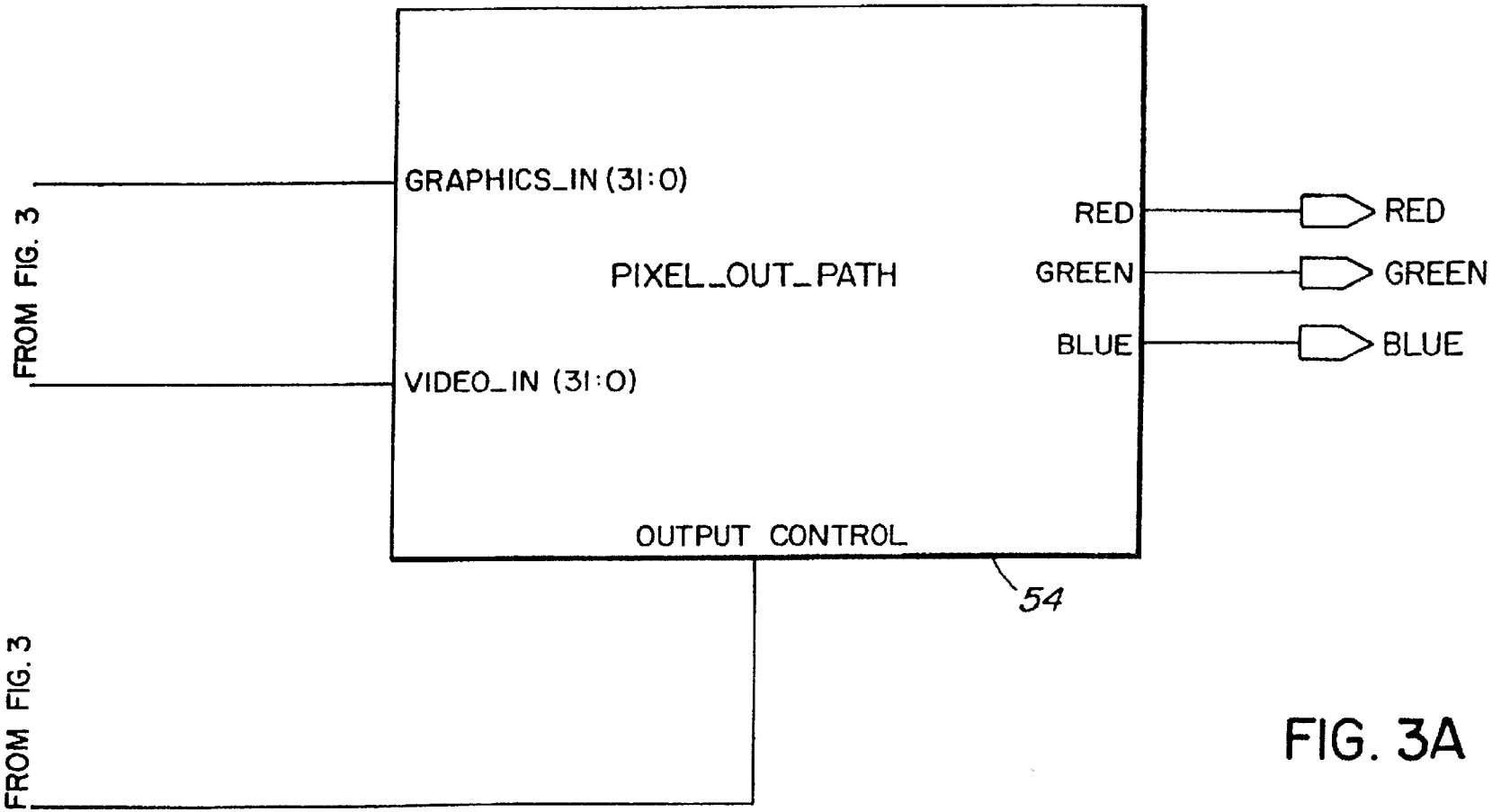
Figure 4:
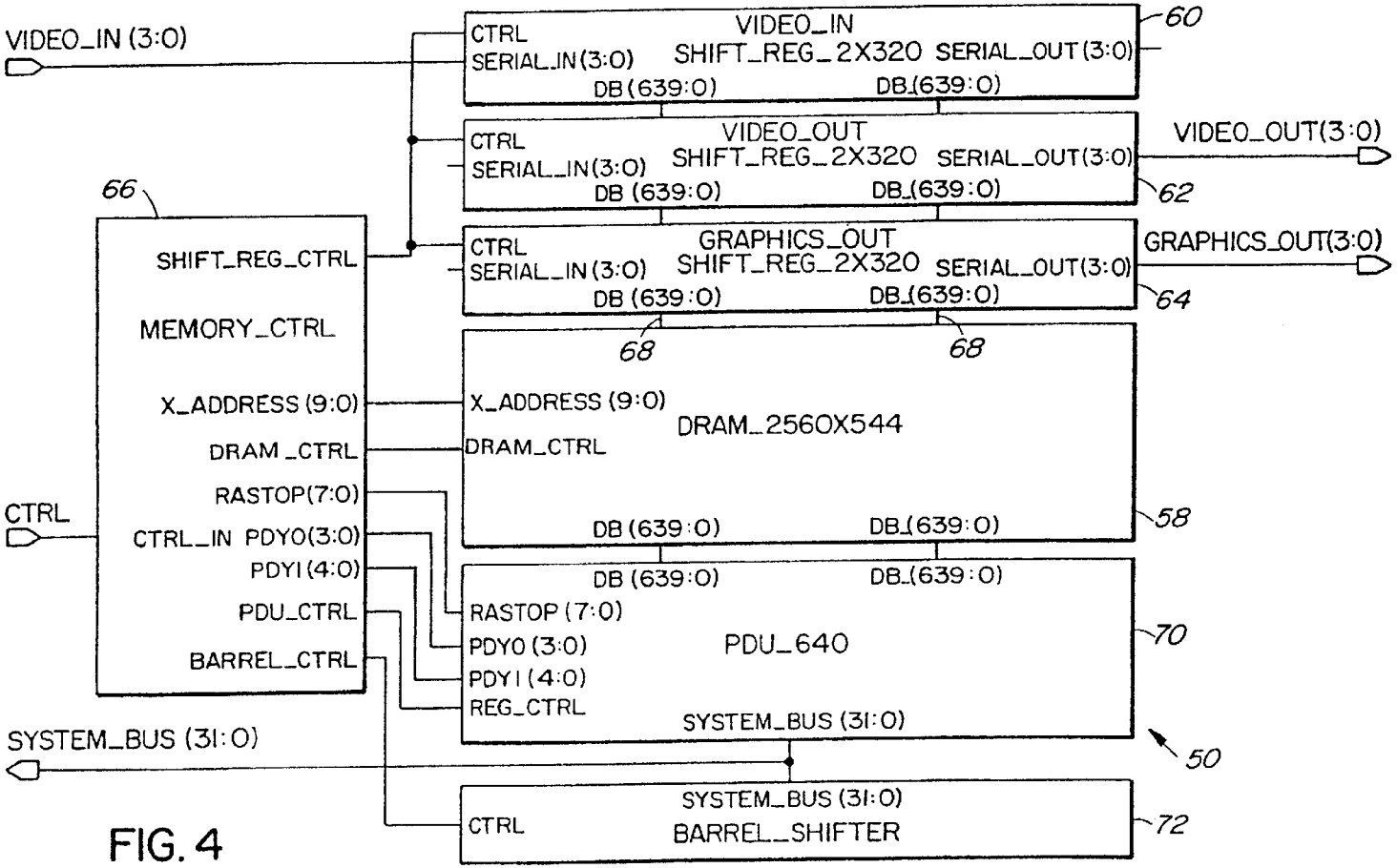
Figure 5:
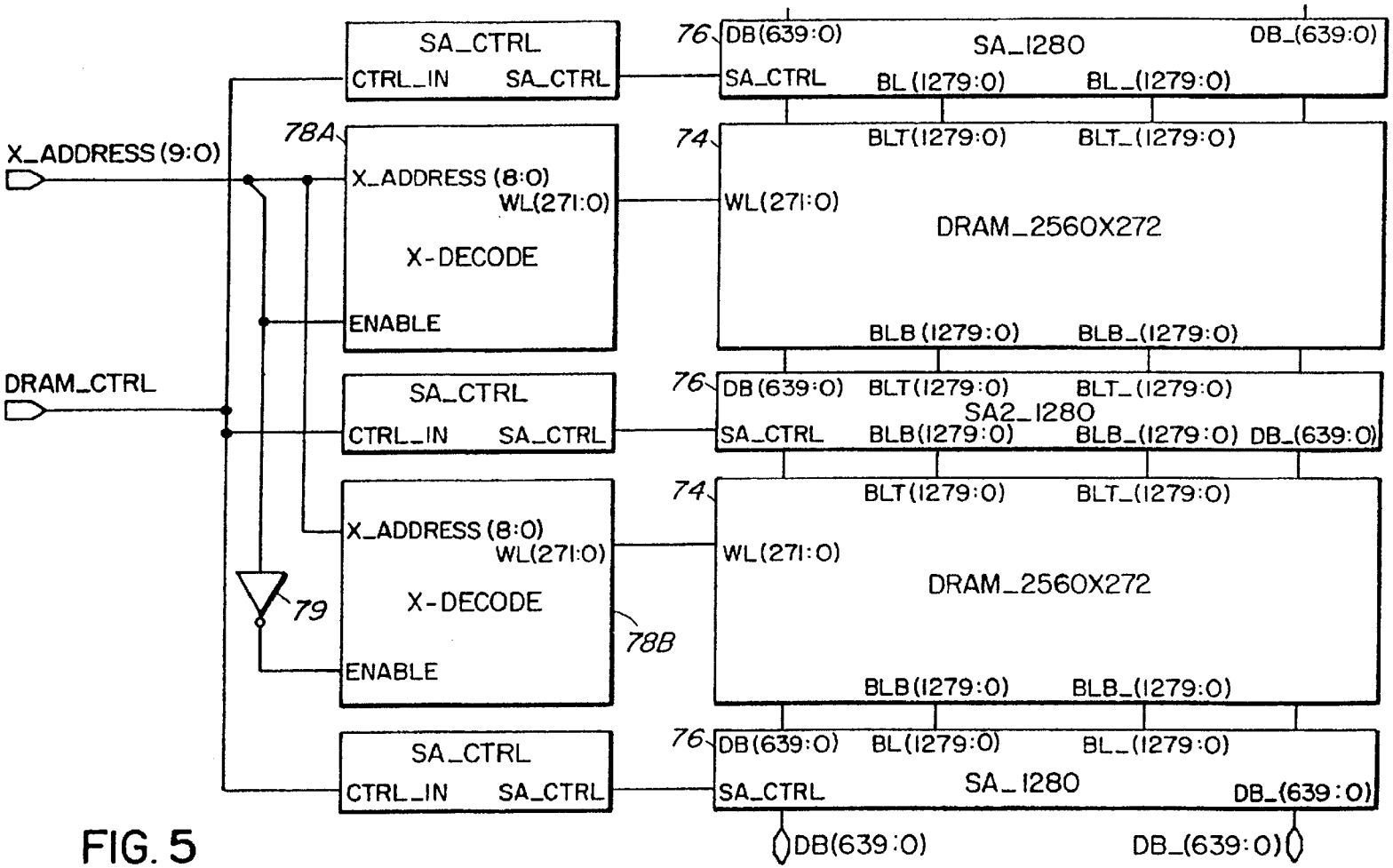
Figure 6:
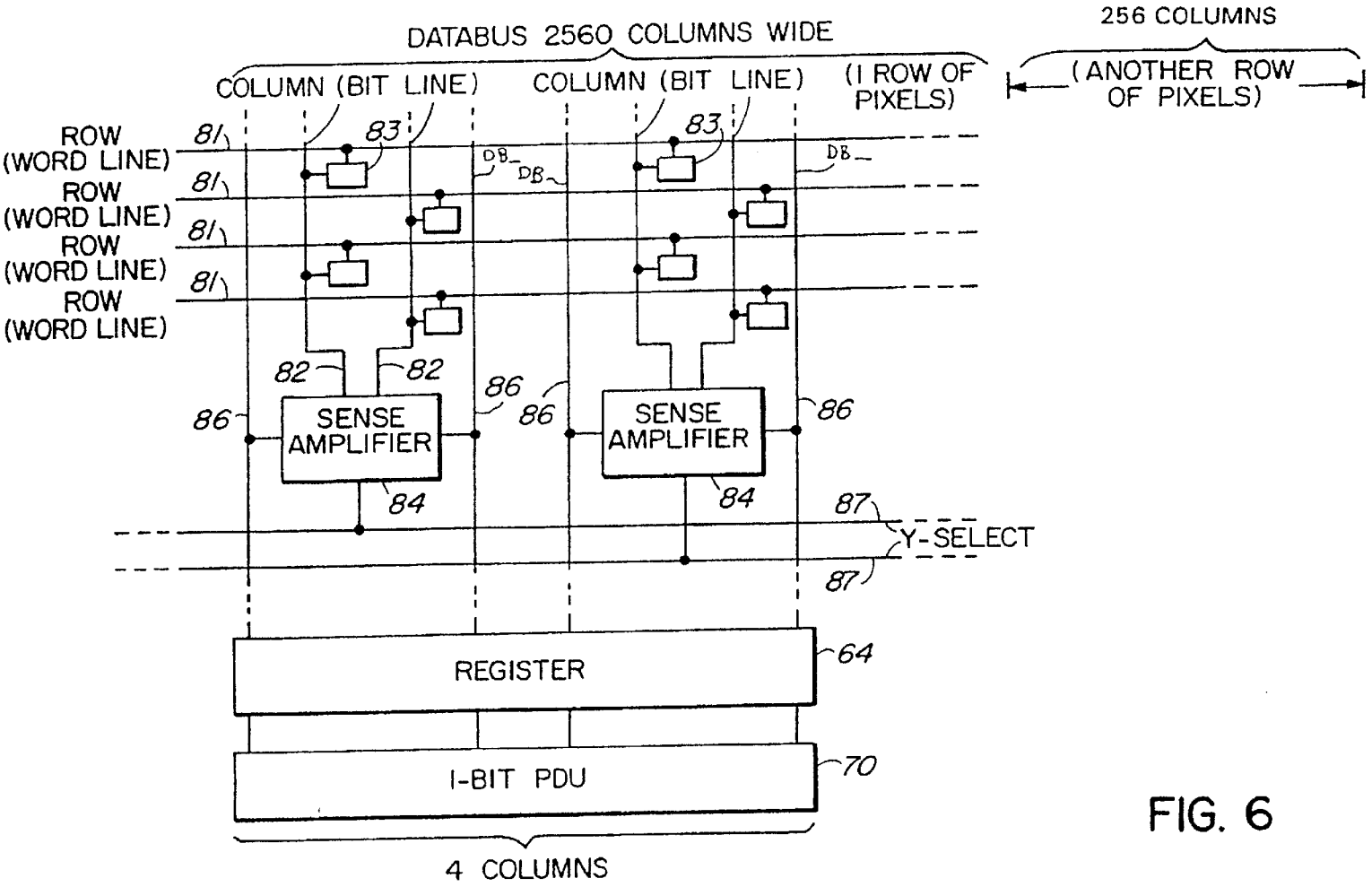
Figure 7:
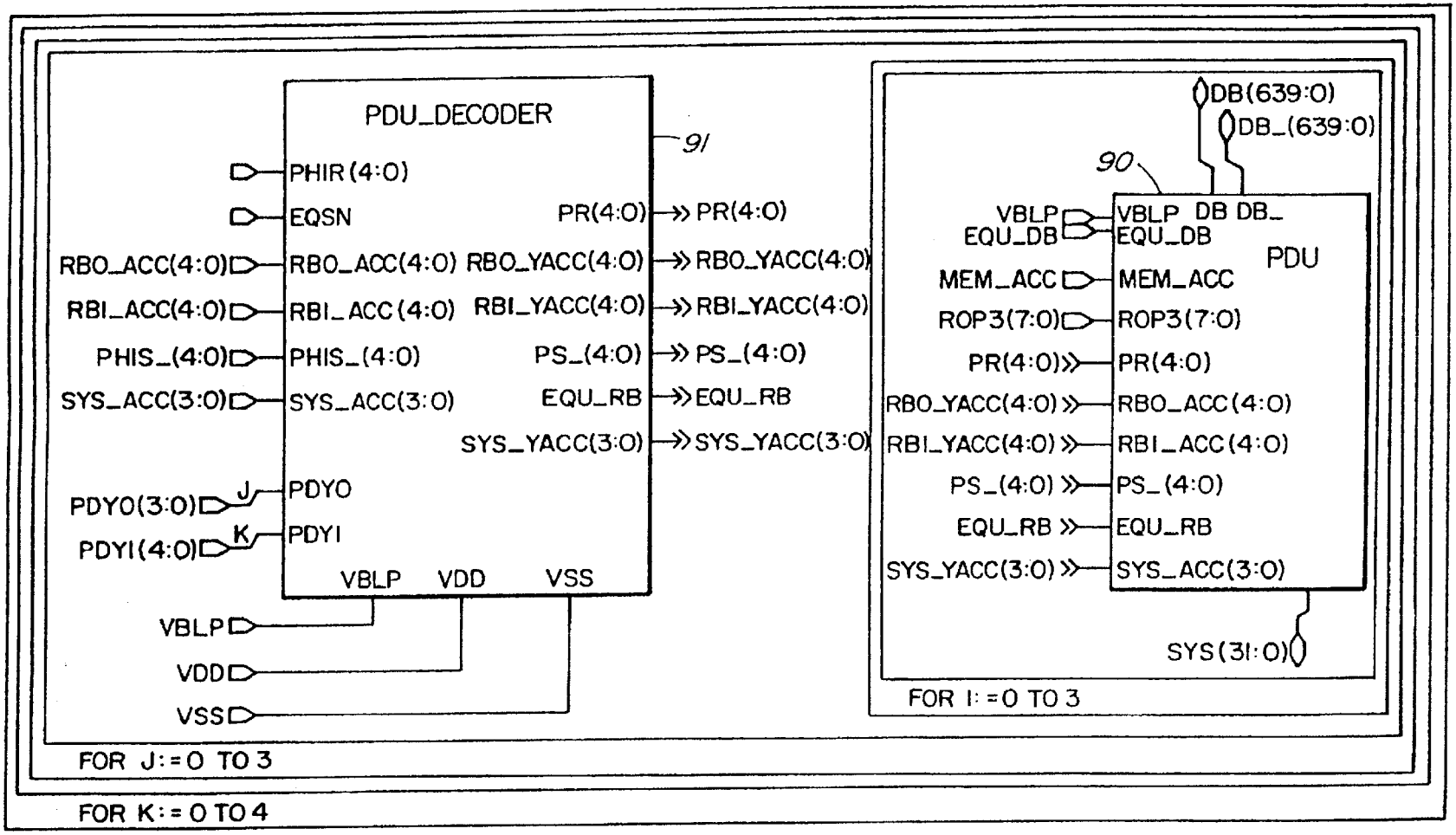
Figure 8:
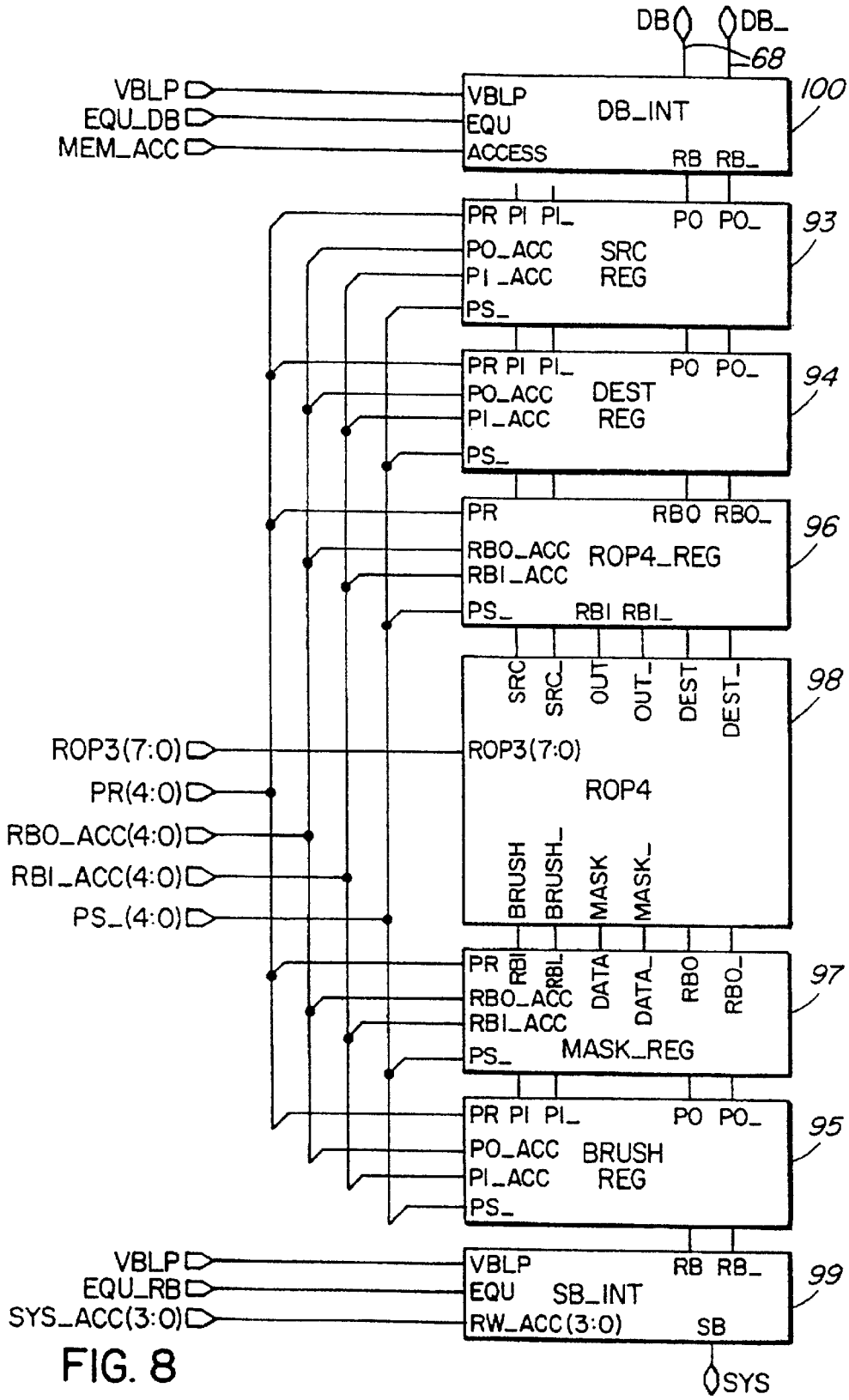
Figure 9:
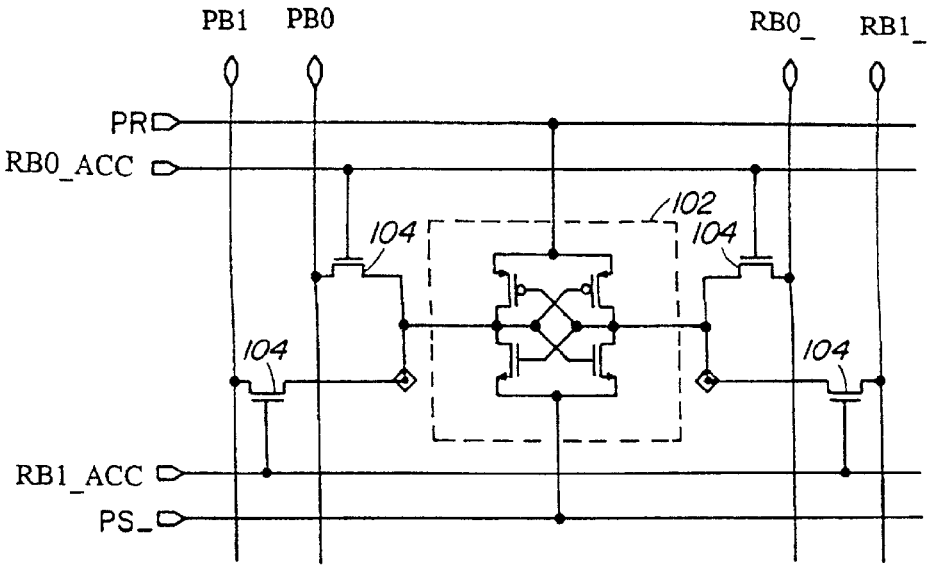
Figure 10:
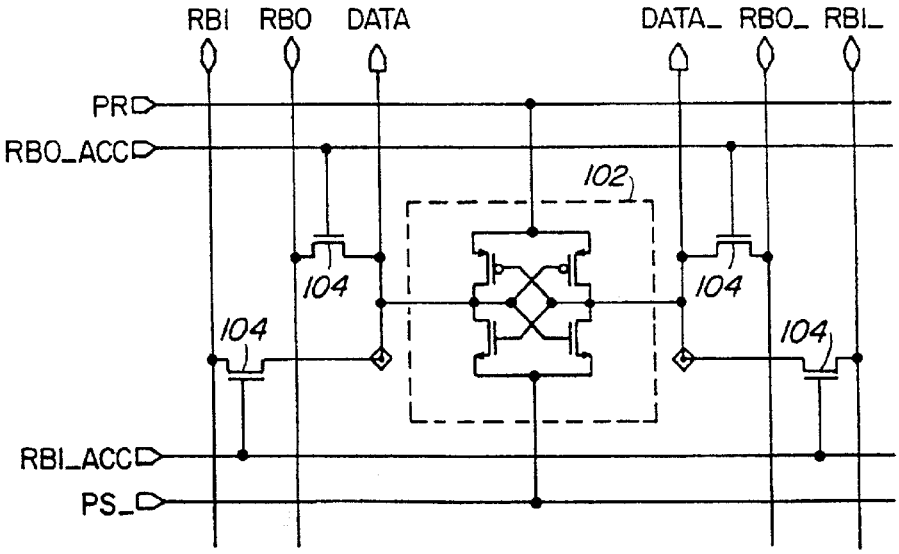
Figure 11:
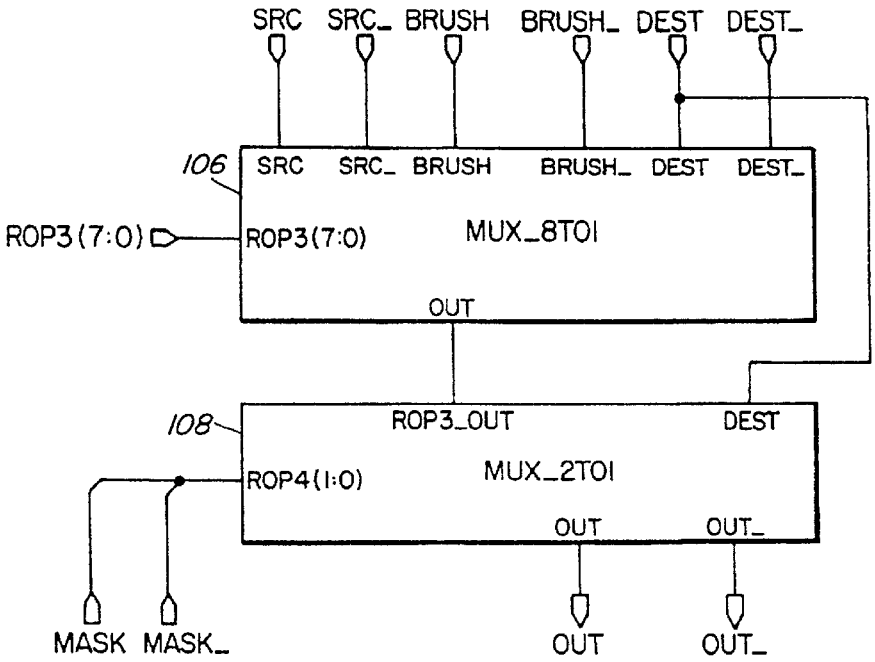
Figure 12:
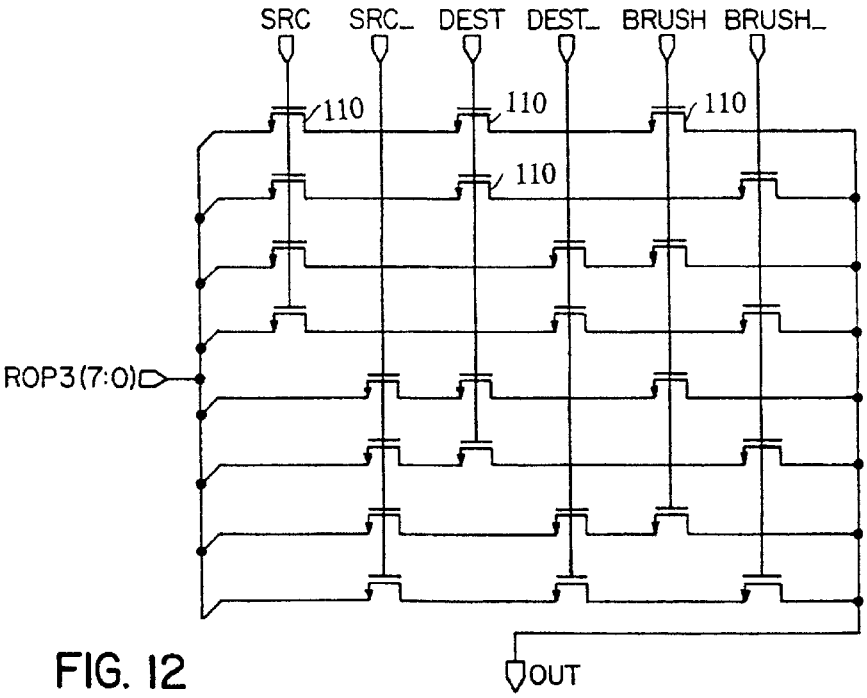
Figure 13:
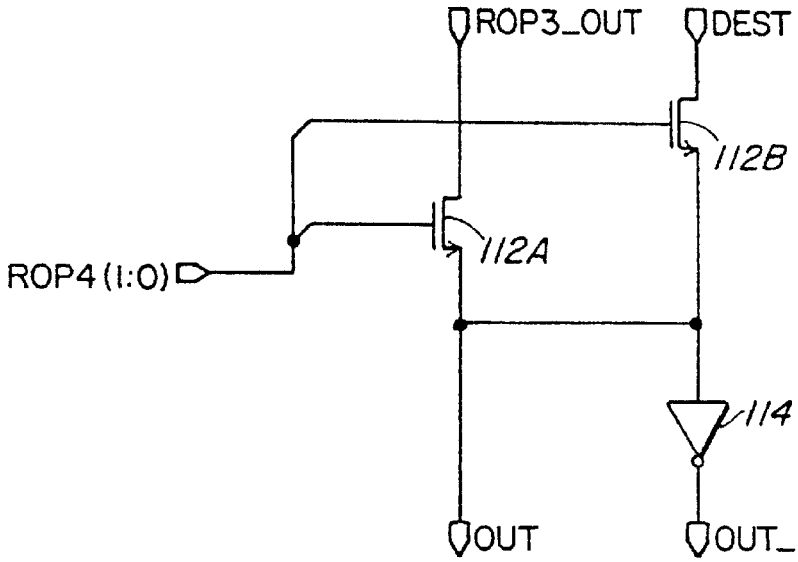
Figure 13A:
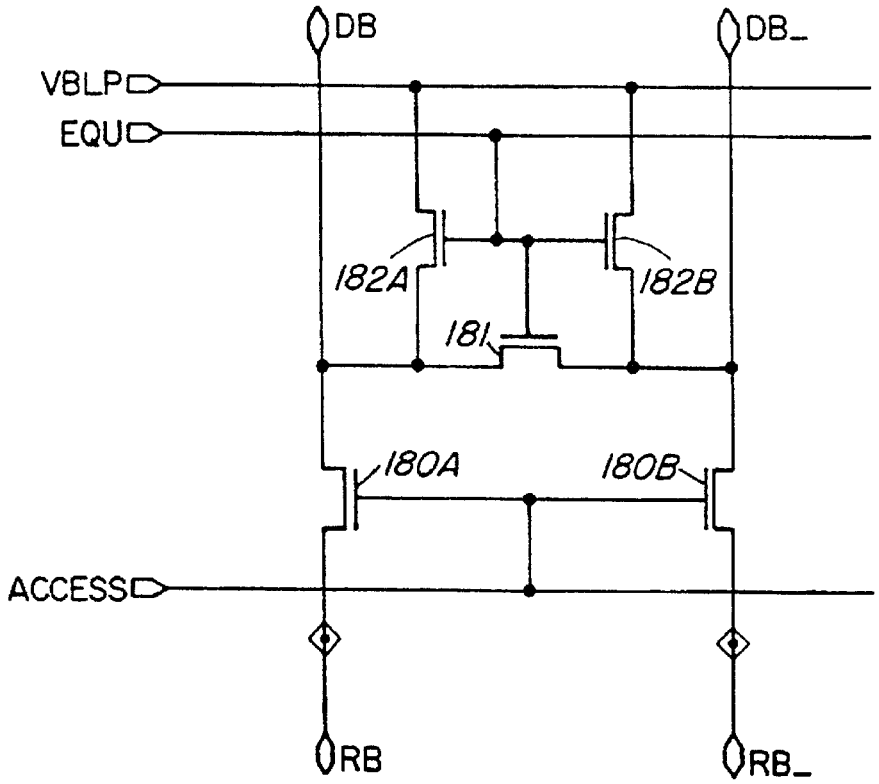
Figure 13B:
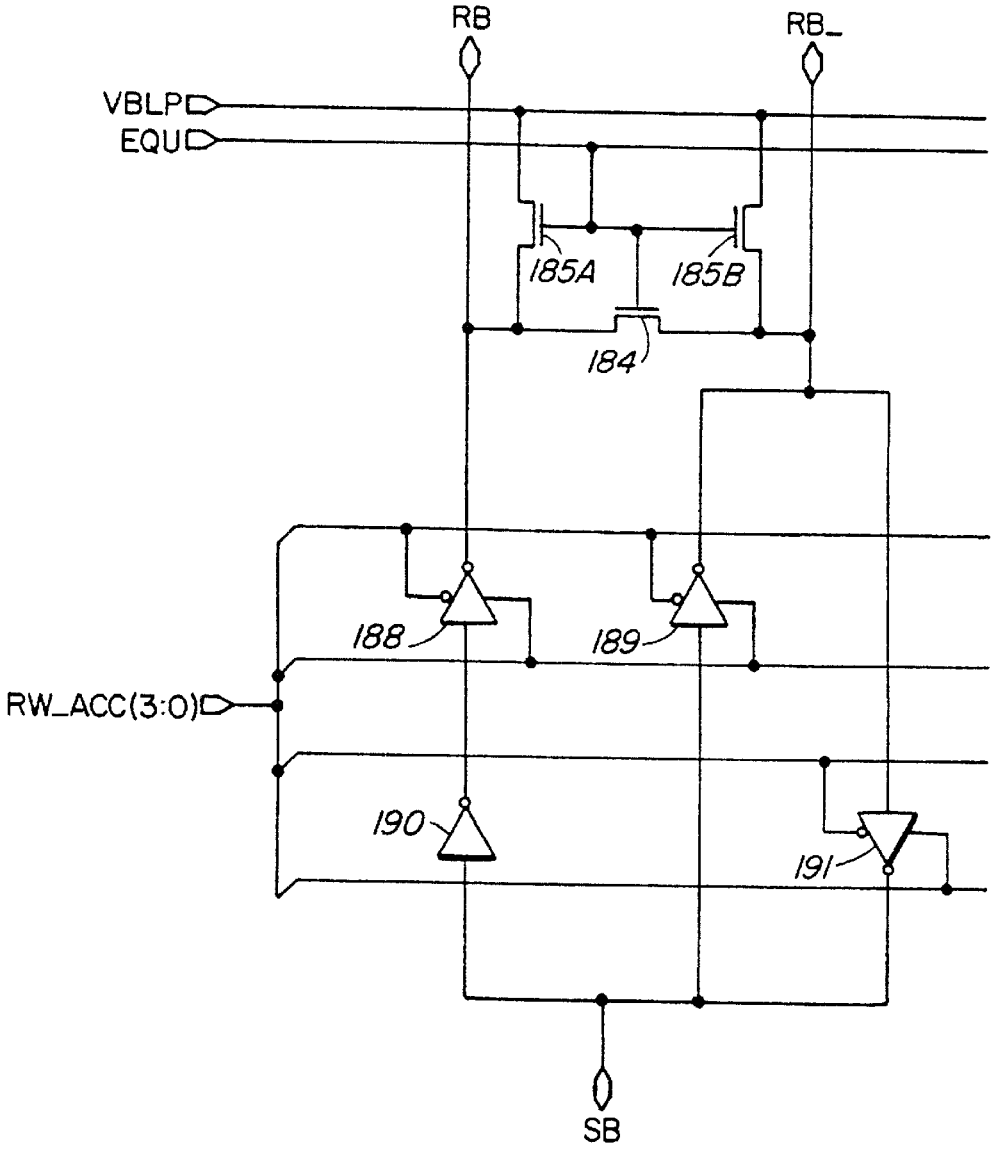
Figure 14:
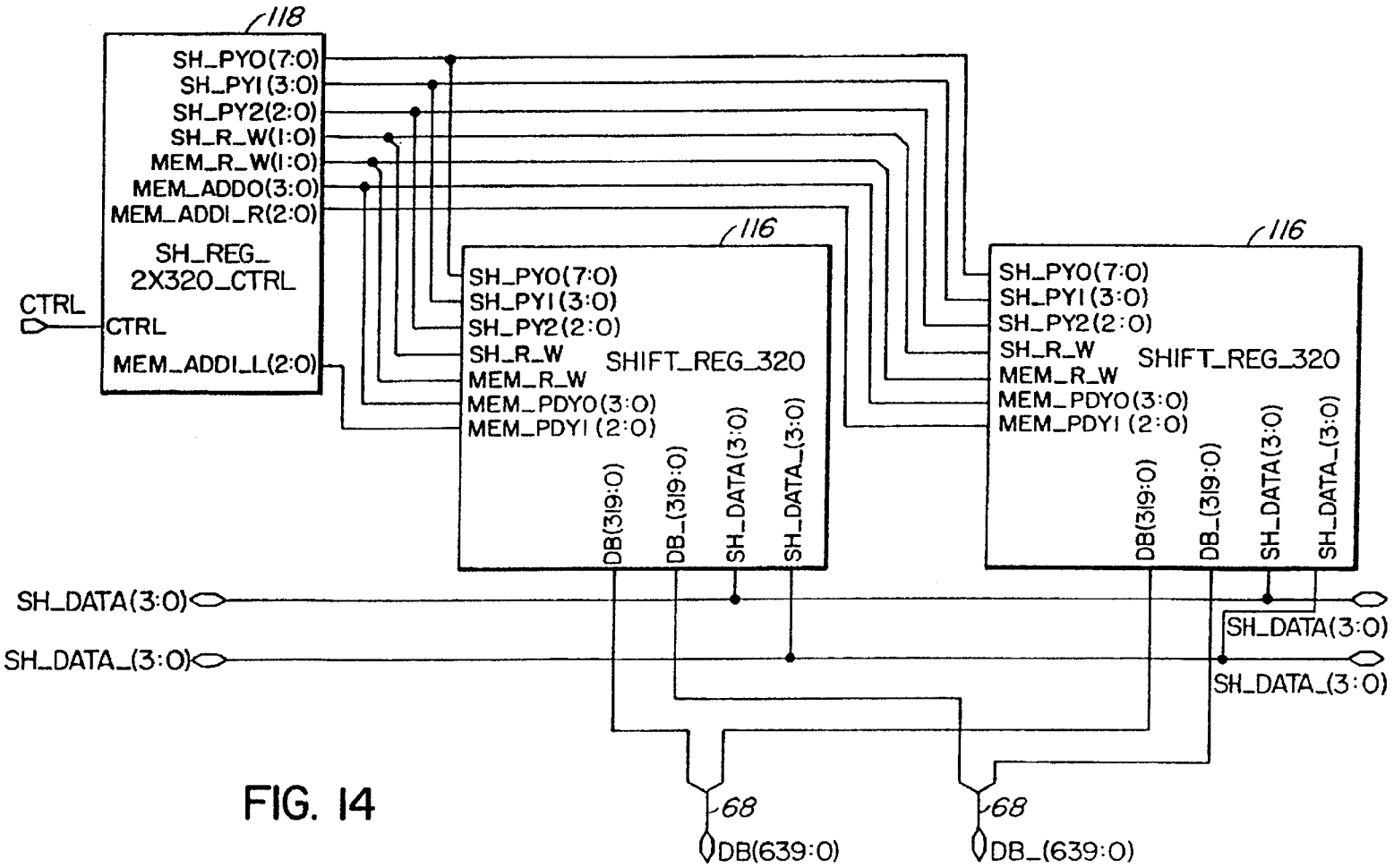
Figure 15:
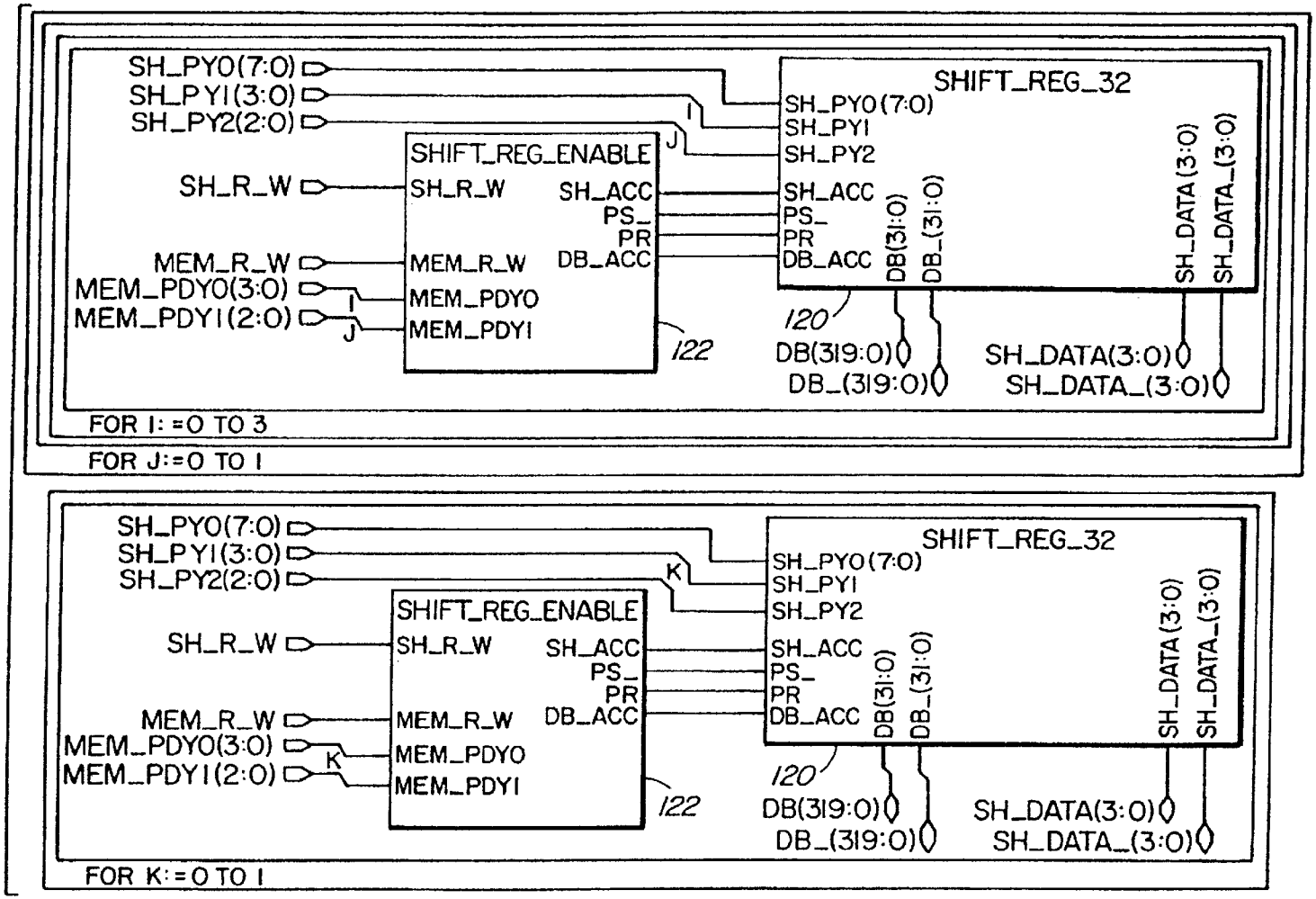
Figure 16:
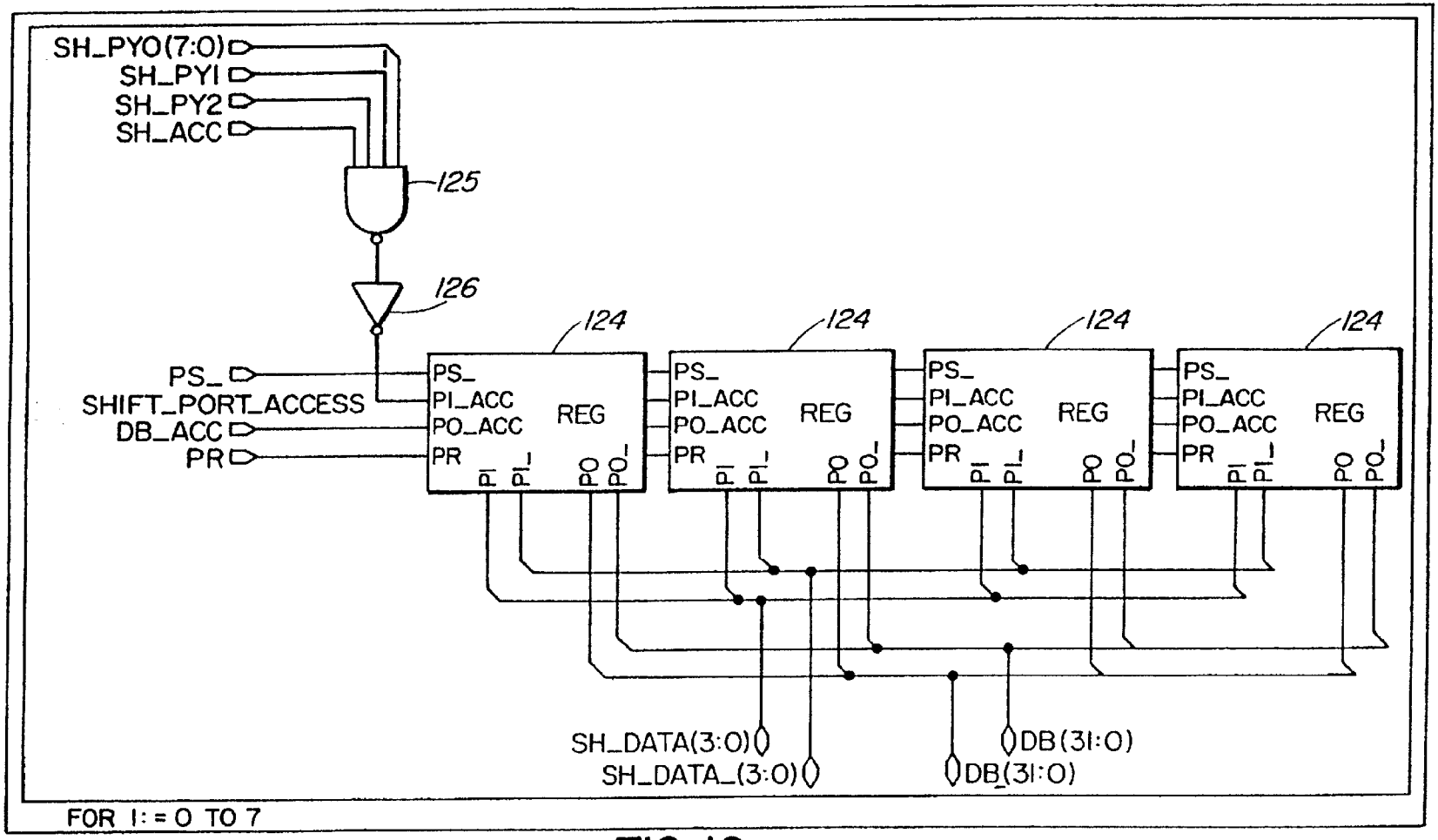
Figure 17A:
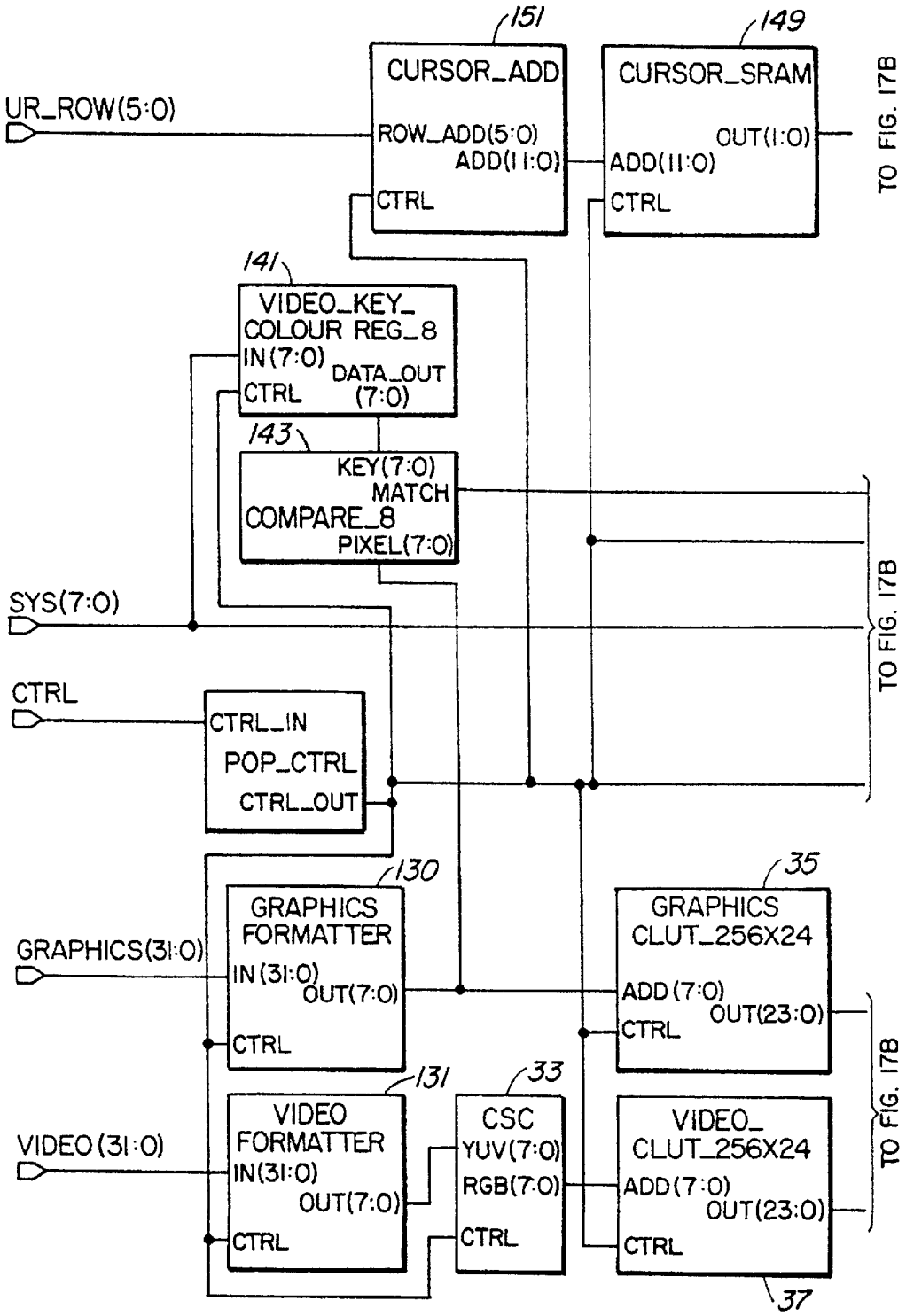
Figure 17B:
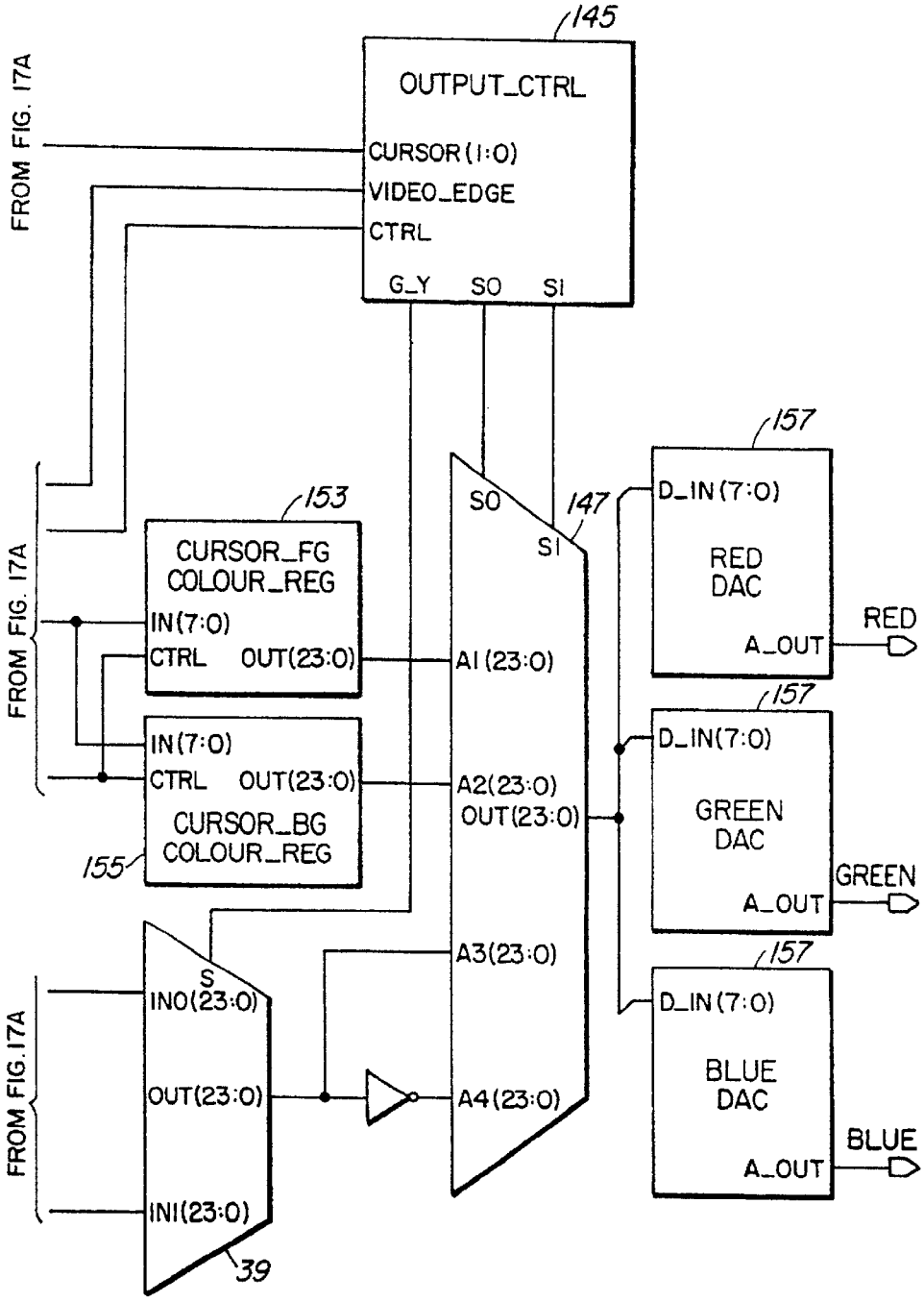
Figure 18:
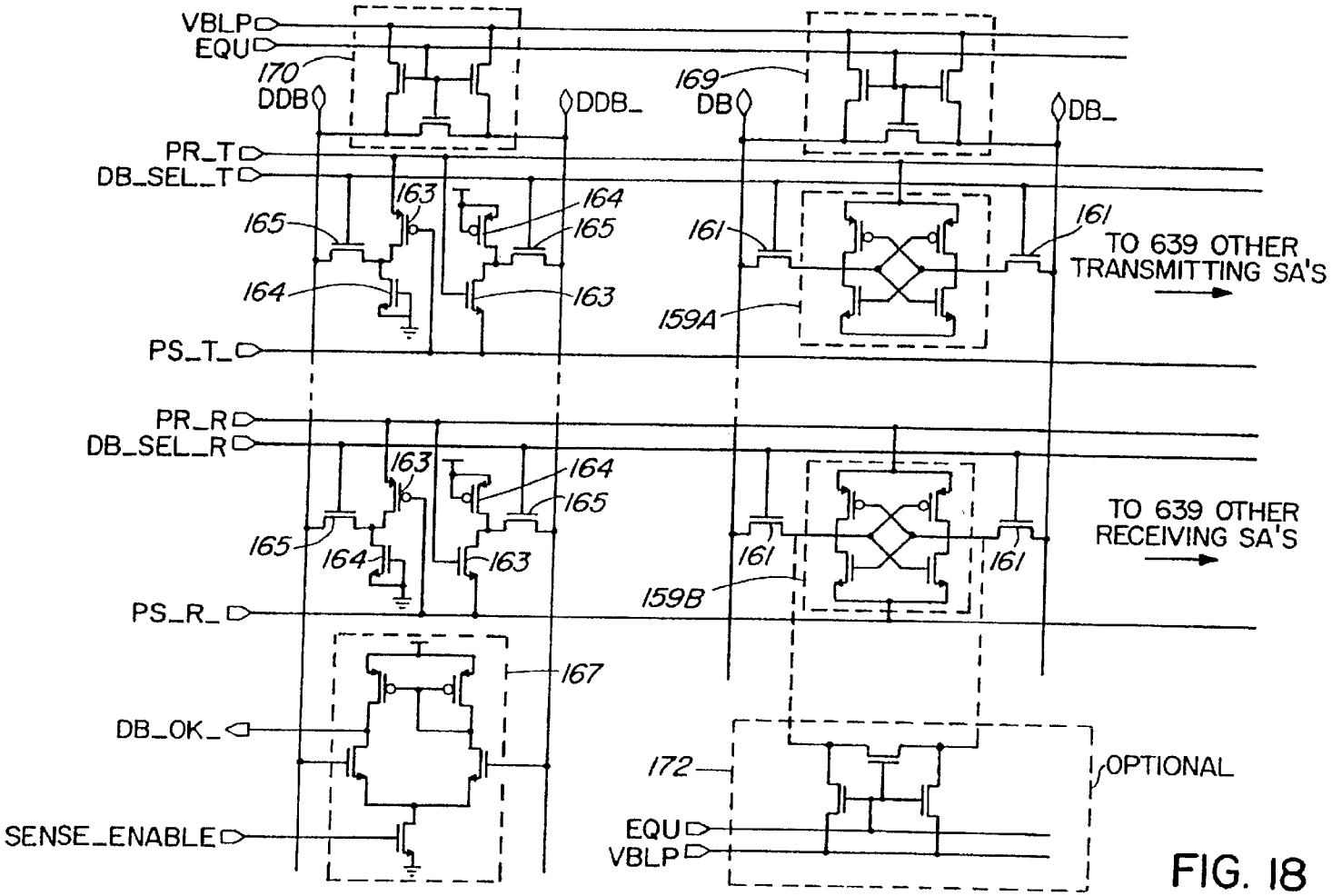

A better understanding of the invention will be obtained by reading the description of the invention below, with reference to the following drawings, in which:

FIG. 1 is a block diagram of the architecture of a basic personal computer in accordance with the prior art, FIG. 2 is a block diagram of a display processor portion of a personal computer in accordance with the present invention, FIGS. 3, 3A are a block diagram of a frame buffer and pixel output path subsystem used in the preferred embodiment of the present invention, FIG. 4 is a block diagram of a single frame buffer block used to form part of the frame buffer subsystem, FIG. 5 is a block diagram of a DRAM of the single frame buffer, in more detail, FIG. 6 is a partly schematic and partly block diagram of the DRAM, illustrating the locations of the rows, columns, sense amplifiers, databus lines and Y-select lines, FIG. 7 is a block diagram of a PDU, FIG. 8 is a block diagram of a 1 bit PDU, identical units of which form the PDU of FIG. 7, FIG. 9 is a schematic diagram of a source, destination, brush or processing register used in the 1 bit PRU of FIG. 8, FIG. 10 is a schematic diagram of the mask register, FIG. 11 is a block diagram of the ROP4 processor, FIG. 12 is a schematic diagram of an implementation of an 8 to 1 multiplexer, FIG. 13 is a schematic diagram of an implementation of a 2 to 1 multiplexer, FIG. 13A is a schematic diagram of a preferred form of databus interface, shown in FIG. 8, FIG. 13B is a schematic diagram of a preferred form of system bus interface, shown in FIG. 8, FIG. 14 is a block diagram of any one of the 2 by 320 bit shift registers described with reference to FIG. 4, FIG. 15 is a block diagram of a single one of the 320 bit shift registers described with reference to FIG. 14, FIG. 16 is a block diagram of a single 32 bit shift register used in the 320 bit shift registers described with reference to FIG. 15, FIGS. 17A, 17B are a block diagram of the output path subsystem illustrated in FIG. 3, and FIG. 18 illustrates a circuit for minimizing the power utilized in the massively parallel databuses described in this patent application.

DETAILED DESCRIPTION OF THE INVENTION

Turning to FIG. 1, the basic architecture of a personal computer is shown. A central processor (CPU) 1 is interfaced with a standard bus 3, commonly known as an ISA bus. The CPU communicates via bus 3 with read only memory (ROM) 5, which typically stores boot programs in firmware, and random access memory (RAM) 7, which typically stores programs, files and data which is in use by the computer. The CPU 1 also communicates with a hard disk drive 9, which stores programs, files and data in a non-volatile manner, with a printer 10, a keyboard 11 and a pointing device 12 (such as a mouse or trackball) via bus 3.

While in older computers a display 13 interfaced the bus via a display processor connected to the ISA bus, in recent years demands on the computer for speed have required some changes, for example to handle video or other multimedia applications. One of the major speed bottlenecks of the computer has been the speed of the ISA bus, which could not handle signals involved in multimedia with sufficient speed. Therefore a new bus was created, referred to as a local bus or VESA bus, referred to in FIG. 1 as system bus 15, the operated at a much higher speed than the ISA bus, and which interfaced the computer system CPU 1 via a buffer 17. A video interface circuit 19 connected to the bus 15, as well as a graphics processor 21 and ancillary circuits. The digital output signal from the graphics processor 21 is applied to a look-up table (LUT) 23, where the color of each pixel is retrieved, and the output signal of the LUT is applied to a digital to analog converter 25 where the signal is converted to analog red, green and blue (RGB) signals which are applied to the display 13.

As is well known, the graphics processor is comprised of a drawing engine 27, a display processor 28 and a CRT controller 29. The graphics processor stores pixel data to be displayed in a memory 31 which is typically VRAM (video random access memory), called the frame buffer, the pixel data being created or modified by the drawing engine, restored by the display processor in the VRAM memory, and output to the LUT 23 for subsequent display by the CRT controller.

The graphics processor communicates with the memory 31 via a bus 33, the size of which has been determined by the system bus, and the bus size which could be handled by the display processor. As noted earlier, this bus has been 16 or 32 bits in width, with only the most powerful recent computers using a 64 bit bus. The speed of the graphics processor is proportional to the speed that the system can process pixels, which is limited by the speed at which it can transfer data to and from VRAM 31. This speed has been limited by the width of bus 33.

Turning to FIG. 2, the elements connected to the system bus of the prior art have been replaced in the present invention with a single chip display processor, a preferred embodiment of which will be described below.

In place of the graphics processor of the system of FIG. 1, a display processor 40 is connected to the system bus 15 via an e.g. 32 bit bus 41 and a control input (not shown in this figure) and receives digitized video signals via a 4 bit bus 42. The display processor is comprised of a DRAM memory 44, a pixel processor 46 and a pixel logic system 45, and a triple RAMDAC 49 in a single integrated circuit. As will be explained below, this is further described as a pixel frame buffer subsystem, a pixel output path subsystem, a video input formatter 48, and a frame buffer control. These are interconnected to provide the function of a graphics accelerator.

A drawing engine 47 may also be connected to the system bus for generation of graphics data, provided via the bus 41 to be stored in memory 44 for further processing. Alternatively the drawing engine may be implemented in program instructions to the pixel processor from the main computer processor, whereby the drawing function is provided by the present invention as will be described later.

In the present description, each pixel is described by eight bits.

FIG. 3 illustrates the frame buffer and pixel output path subsystem which forms the preferred embodiment of the present invention. The eight bit per pixel frame buffer subsystem forms the largest subsystem of the present embodiment, and is comprised of eight separate frame buffer blocks 50. Each of these blocks holds one bit of each pixel of an entire frame defined by the 8 bit pixels. This organization allows all pixels to interact with each other on a bit by bit basis within a single frame buffer block, thus facilitating increased speed and bandwidth of processing between the pixels.

A 32 bit bus 52 connects each of the frame buffer subsystems to the system graphics processor (corresponding to bus 41 of FIG. 2). The system can read 32 bits per cycle. During a write cycle, however, the system can broadcast data to all eight buffer blocks 50, allowing an effective write width of 256 bits (32×8). The width of the system bus however, is a trade-off between the silicon area required and the throughput (which increases proportionately to the width of the bus). It should be recognized that the system bus can have any number of conductors which is typically a number to the power of 2.

A second major subsystem is a pixel out path subsystem 54. The pixel out path subsystem is comprised of a graphics pixel input port and a video pixel input port, each of which is 32 bits (4 pixels) wide, and which are connected to graphics out and video out ports respectively of the frame buffer. The pixel out path requires data for only one pixel for each output cycle. The four pixel wide input for graphics out and video out allow for the frame buffer output operations to run at ¼ the output cycle speed. However other widths (bit capacities) of these inputs can be used to allow output registers of the frame buffer (to be described later) to run at other speeds. For example, input pixel widths for graphics out and video out of eight allow the frame buffer output registers to run at ⅛ the output frequency.

The pixel out path 54, receiving pixel data on the graphics in and video in inputs reformats these pixels, and outputs red, green and blue analog signals (RGB in FIG. 2) for display on a monitor. Detailed operation of the pixel out path 54 will be described below with reference to FIG. 16.

A frame buffer control 56, connected to the frame buffer blocks 50, receives control data on a FRAME_BUF_CTRL bus from the system processor, and controls the frame buffer's operation, including DRAM control, functions of the frame buffer blocks such as operations of their pixel data units (to be described below), and the video in, video out and graphics out operations.

A video in formatter 58 receives incoming video pixels on a 16 bit bus VIDEO_IN, and reformats the video pixels to allow for efficient storage of these pixels.

FIG. 4 is a block diagram of one of the identical frame buffer blocks 50 described with reference to FIG. 3, which preferably forms a 1280 by 1024, 1 bit pixel frame buffer block. This is preferably implemented by using a DRAM 58 comprised of 2560 columns and 544 rows, in which the display pixels are stored.

It is advantageous to organize the memory to closely resemble the display. For example one row of display pixels should be stored in a single row of the memory. When the pixels are displayed on the display screen they are displayed one pixel at a time. First one row is scanned, then there is a retrace interval, then the next row is scanned. Therefore all the pixels of one row is read before any pixels of the next row. Thus the DRAM can be read in a manner similar to a fast page mode. This operation runs faster than consecutive random accesses since access to a row takes longer than accessing bits from that row. It also uses much less power, since a row cycle uses much more power then reading a bit from that row.

The size of each DRAM buffer block being chosen to be 2560 columns wide is based on two factors: optimizing the aspect ratio of the DRAM buffer blocks, and the fact that one wordline (row) can presently have a maximum of only about 2500 columns (due to capacitance and speed considerations). Therefore, for a maximum display screen size supported by a system of 1280 by 1028 pixels, two rows of pixels will fit in one row of a DRAM buffer block. To support 1024 rows of display, the DRAM must therefore have 512 rows. An extra 32 rows of DRAM was added to each buffer block in a prototype system, and which is currently preferred, which can be used for multiple purposes, such as a scratchpad memory for the graphics processor, to store pixel colors and patterns for the PDU registers (PDU registers to be described below), to store fonts for text, to store video, etc. It is often advantageous to store pixel data for full motion video in a separate area of memory, rather than in the actual display memory area, which allows the video data to be stored in a different format from the graphics data, and many sophisticated display functions to be handled. Therefore the extra 32 rows of DRAM (or equivalent 64 rows of display pixels) can be used to store these items.

Of course if the display is not the maximum 1280 by 1024 pixels, more lines of memory become available for these functions, including full-motion video, allowing higher resolution video to be stored. It will also be recognized that the invention is not restricted to using 32 extra rows of DRAM, as none, fewer or more extra rows may be used.

A DRAM buffer block size of 2560 columns by 564 rows is another good selection. This allows support of a 1280 by 1024 pixel display in an eight bit pixel mode, and allows support of an 800 by 600 (SVGA) display in true color mode (24 bits per pixel).

In general, this invention can be implemented using any effectively size DRAM array, depending on the factors deemed most important.

Each frame buffer block 50 also is comprised of three shift registers, a video in shift register 60, a video out shift register 62, and a graphics out shift register, having control inputs connected to a memory control 66. The video out shift register has a video output port VIDEO_OUT and the graphics out shift register has a graphics output port GRAPHICS_OUT, which are input to the VIDEO_IN and GRAPHICS_IN input ports of the pixel output path subsystem 54 (FIG. 3). These three shift registers are used for the inputting of video pixel data from an external source, and the outputting of video and graphics pixel data to the pixel out path subsystem for subsequent transmission to the display. Since the incoming and outgoing pixels are transferred one pixel at a time, sequentially along a row, these shift registers are configured similar to a VRAM (video random access memory). The register are preferably 640 bits wide (configured as two, 320 bit registers as will be described later).

It is important that these registers should be pitch matched to the DRAM buffer blocks, that is, that each register bit storage structure is the same physical width in the integrated circuit as four columns of the DRAM buffer blocks.

While the shift registers could be configured as 1280 bit wide pitch matched shift registers, this would require twice the integrated circuit area as the 640 bit form, but would allow an entire line of 1280 pixels to be stored in the shift registers. In general, any useful width of pitch-matched shift registers could be used, using the operational schemes described herein.

Each of the shift registers operate in a similar manner, and therefore operation of only the graphics out shift register 64 will be described below.

During the display retrace interval, the system processor requests a new row of pixels to be output for display. A single wordline in the DRAM frame buffer 58 is brought to high logic level, and a row of DRAM is read. 320 bits of this row are then transferred to the graphics out shift register 64 in a single cycle, via the databus 68. When the system asks for the first pixel, the graphics out register 64 begins to shift its data out data out serially. Any time during the shift out period for these 320 pixels the system can ask for the next set of 320 pixels. The DRAM buffer block then reads the row containing the next 320 pixels, and writes these into the second 320 bit graphics out register (recall that the graphics out register is formed of two, 320 bit registers).

As soon as the first set of 320 pixels has been serially read out, the second graphics out register is begun to be read. Then, any time during read-out of the second graphics register, the next 320 pixels can be loaded into the first 320 bit register. This process continues until the end of the data has been read that constitutes a line (i.e. a maximum of four times for the largest screen of 1280 pixels width).

Since in this preferred embodiment there are eight frame buffers working in parallel, and graphics pixels are typically stored as eight bits per pixel, only one bit is required per pixel from each graphics out register. However four bits are preferably output in parallel to allow the cycle time of the shift register to be four times slower than would be the case if one bit were output at a time. In the case of a screen size of 1280×1024 pixels running at approximately a 70 Hz refresh rate, the output pixel rate is 135 MHz. With four bits output in parallel, the shift register need only run at 34 MHz, making it easier to realize.

The video out shift register 62 should operate in a similar manner as the graphics out shift register. This shift register is used when a video window is encountered. The system determines when this register is to be loaded from the frame buffer block 58 with a further 320 bits of data. This data is then shifted out as for the graphics out register 64.

The video out shift register 62 should operate in a similar manner as the graphics out shift register. This shift register is used when a video window is encountered. The system determines when this register is to be loaded from the frame buffer block 58 with a further 320 bits of data. This data is then shifted out as for the graphics out register 64.

The video in shift register 60 has an input bus VIDEO_IN, shown as a 4 bit bus, for carrying a serial input video stream. Shift register 60 accumulates video data until one of its 320 bit registers is full, and then downloads this data to the frame buffer. This input video stream originates off-chip from a source such as a VESA (Video Equipment Standard Association) media channel, illustrated in FIG. 2 as input 42. Therefore it runs at a relatively slow speed, the digitized video data being input on only a four bit bus even in a 32 bit per pixel mode.

A pixel data unit (PDU) 70 is pitch matched to each frame buffer block 58, and is connected to the massively parallel bus 68 as well as to memory control 66. Each PDU processes 640 bits, allowing 640 pixels to be processed in parallel, using different functions available for pixel processing. In general, any bit width could be used for the PDU. A width of 640 is preferred, however, in order to allow this circuit to be pitch matched to the DRAM 58 (one PDU bit for each 4 DRAM columns).

As with the shift registers, a trade-off exists between maximizing the number of bits of width of the PDU to allow greater processing throughput, while minimizing the integrated circuit chip area required. For example, a width of 320 bits would require only one-half the integrated circuit area, and would allow similar operations to take place, but in twice the number of cycles. However, whatever PDU bit size is chosen, it should be pitch matched to the DRAM.

A common operation required to be implemented in bit-mapped pixels is a bit block transfer, i.e. to move any block of pixels to a new location on the display screen simultaneously performing logic operations (hence from one part of the frame buffer DRAM to another). Since each of the eight frame buffer blocks holds one bit of each pixel of the entire frame, then these move functions can be entirely local to each frame buffer block and can happen simultaneously in all eight blocks. To move vertically, the DRAM accesses one row, stores this in sense amplifiers or in a PDU register, then writes this back to a different row. To move horizontally, since the system can access the PDU registers in 32 bit words (in this embodiment), then any pixel can be moved horizontally by any multiple of 32 using the system bus, in blocks of up to 32 bits at a time. In order to move in a finer resolution, a barrel shifter 72 is used, respectively connected to each PDU via the system bus, and connected to the memory control 66.

Memory control 66 for each frame buffer block includes standard memory control circuits used to control DRAMs. It also includes an instruction decoder for PDU operation, and PDU, barrel shifter addressing and control circuits.

It is also preferred that the memory control 66 should contain a range decoder. Normally a decoder allows one of a set of inputs to be selected. A range decoder allows any consecutive range of this set of inputs to be selected. For example, for the twenty 32 bit wide PDU circuits, a normal decoder allows access to only one of the 20 PDUs. A range decoder allows access to one PDU, all 20 PDUs, PDUs having two adjacent address, or to PDUs having any number of adjacent addresses up to the full complement of PDUs, i.e. twenty. This allows many different widths of data to be written into the PDU by the system. For example it allows the system to clear the entire width of a PDU register in a single cycle, or to load any pattern repeated on a 32 bit boundary into the entire PDU in one cycle.

Indeed, a partial range decode function may be implemented. This allows some range decode functions, such as choosing 1 of 20, 20 of 20, or a group of 2, 4 or 8 of 20 PDUs. An advantage of using this decoder is that it can be implemented with standard pre-decoded addresses. Rather than only allowing a single bit of each predecoded bus to be set to 1, any number of bits on each bus can be set 1. This takes no more area in the dense pitch matched circuitry, but allows many more degrees of freedom for writing to registers.

Range or partial range decoding can be used not only for the PDUs, but for the shift registers and for the DRAM itself. In the shift registers it allows only a portion of each 320 bit register to be loaded, or written to memory. In the DRAM, multiple wordlines can be allowed to go high. This allows such functions as a flash clear of memory, or a flash clear of a subsection of the memory, and a pattern load to a large section of the memory.

FIG. 5 is a block diagram of a 2560 by 544 bit implementation of the DRAM in more detail. The DRAM block size is constrained to 272 rows (the constrained blocks shown as elements 74) so that the ratio of bitline capacitance to cell capacitance should remain reasonable (of the order of 10). A row of sense amplifiers 76 is located along each side of the array to sense and restore the DRAM cells, as in a standard DRAM. In the invention the bitline sense amplifiers can have the added function of serving as temporary data registers for PDU operations while the associated memory array is not being accessed. In the embodiment shown, the addresses are passed via X_ADDRESS input line to X decoders 78A and 78B. Only one of these decoder arrays is enabled at any one time via inverter 79 so the most significant X-ADDRESS bit is used uninverted for decoder 78A and inverted for decoder 78B enable.

A major difference between the DRAM used in the present invention and a standard DRAM is the wide data bus structure. In a standard DRAM one wordline allows one row of cells to be accessed and read by a row of sense amplifiers. Then a small subset of these sense amplifiers is enabled by a Y-select signal to dump the data stored in the cells sensed by the subject onto the databus. Typically the data bus is only 4 or possibly 8 bits wide, and runs parallel to the rows and wordlines over the sense amplifiers. The Y-select lines 87 run parallel to the columns and bitlines and run over multiple DRAM arrays and sense amplifier rows.

In the present invention, the positions of the databuses and of the Y-select lines are physically interchanged, as may be seen in FIG. 6. In this figure, as in a well known manner the wordlines (rows) 81 run orthogonally to bit lines (columns) 82, with bit storage cells 83 adjacent their intersections, connected so that once a row of cells is enabled via a word line, the charges stored on the cells of the row are dumped to the bitline. A row of sense amplifiers is connected to the bit lines. As is well known, each sense amplifier contains bit line ports, databus ports and Y-select ports.

As noted above, according to the prior art, the databus, connected in parallel to the databus ports of each of the sense amplifiers, ran parallel to the word lines, while the Y-select lines, ran parallel to the bitlines. In the present invention, however, the databus lines 86 run parallel to the bitlines, one pair being connected to the databus port of two sense amplifiers each. Thus there is one databus pair for every four bitlines, and the mass of databus pairs form the massively parallel bus 68.

On the other hand, the Y select lines operate the sense amplifiers 84 in a page mode, and therefore multiple sense amplifiers are selected at the same time. Thus the Y-select lines are connected to Y select ports of multiple sense amplifiers. The Y select lines run parallel to the word lines, only two being required, to choose one of the two sense amplifiers connected to each databus.

FIG. 6 also shows extension of the massively parallel databus lines to a representative one of the registers 64 and to a PDU 70.

From the above it may be seen that the sense amplifiers are addressed via their Y select ports in parallel and output the data sensed to the databus lines in parallel, whereby the data can be transferred in parallel to a register, to the PDU, etc.

With the databus being 640 bits wide in the present example, fully one half of the sense amplifiers are selected for application of data onto the databus simultaneously. As noted above, the two Y-select lines run parallel to the rows of wordlines. The 640 bit databus lines running to the 640 bit wide PDU allows it to be completely loaded or read in one cycle. This scheme can be used for any number of databus lines. For example, 1280 databuses could be run parallel to the bitlines, allowing for the entire row of sense amplifiers to access the databus simultaneously.

FIG. 7 illustrates the 640 bit PDU, formed of 20, 32 bit PDU units 90. Each 32 bit PDU is made up of 32 identical 1 bit PDUs. Each of the 32 bit PDU units is controlled by a dedicated PDU decoder 91, which decodes the PDU address and buffers global signals. As noted earlier, the PDUs are pitch matched to the DRAM, one PDU to four columns. In the DRAM integrated circuit layout, a gap is left between cells where metal wordlines are strapped to polysilicon wordlines. This gap is used in the PDU to locate the PDU decoder 91, and extra power lines for the DRAM.

FIG. 8 is a block diagram of a preferred form of the 1 bit PDU. The 1 bit PDU is comprised of a source register 93, a destination register 94, a brush register 95, an ROP4 register 96 and a mask register 97, a system bus interface circuit 99, and an ROP4 (4 input raster operation) processor circuit 98. All of these circuits are connected to the massively parallel databus via a databus interface 100.

The one bit PDU is the minimum circuitry required to implement standard bit block transfer (BitBlt) commands using 4 input raster operation functions. Since BitBlt is the most often used graphics command, the faster and more efficiently this command can be executed, the more powerful the graphics processor can be. The present invention allows the BitBlt command to be executed in one cycle, and 640 pixels (5128 bits) or more to be processed in parallel.

As is known, execution of a 4 input BitBlt command is basically a copy of a block of pixels from one location on the display (a source) to a second location on the display (a destination), with a logical operation specified between the source and destination pixels. For instance, the source pixel can be ANDed, ORed, or XORed with the destination pixel to which it is written. Additionally a brush variable can be logically operated in with the source and destination pixel to allow further possible functions. Indeed, in the present structure any logical operation on three variables is allowed between the source, destination and brush, with a fourth one bit variable masking the output. Since there are 256 possible logical operations of three variables, each PDU implements all of the operations, plus the masking of the output.

In the embodiment shown in FIG. 8, the three variables are held in the source, destination and brush registers 93,94 and 95, and a mask bit is held in the mask register 97. The ROP4 processor 98 implements the actual operation, and the ROP4 register holds the output data of the ROP4 processor.

All of the registers of the PDU unit are dual-ported to two registers buses RB0 and RB1, and can be accessed by either the memory (through the massively parallel databus 68), by the system (through the system bus SB via the system interface 99), or by any other PDU register. All registers can be connected to the ROP4 processor 98 simultaneously to allow an operation to be accomplished in one cycle.

The layout of the one bit PDU follows the layout shown in FIG. 8. The registers and ROP4 processor are in line and are pitch matched with each other and with the DRAMs. Two different metal buses (one bus extending to the databus and system bus interfaces and one connecting the ROP4 processor with the registers) run over this circuitry, each connected to all registers, but one broken over the ROP4 processor 98.

Since the PDU RB0 bus interfaces directly to the massively parallel databus, the DRAM sense amplifiers can be used as temporary storage registers for PDU operations.

Due to the dense packing of integrated circuit components of the PDU and shift registers, it is preferred that redundancy should be used, whereby extra elements are fabricated and substituted for any elements found faulty. It is also preferred that column redundancy should be used for the DRAMs, whereby unused extra columns of DRAM cells and sense amplifiers are substituted for any found faulty, using well known repair techniques.

FIG. 9 is a schematic diagram of a circuit that can be used for any of the source, destination, brush and ROP4 registers. In order to make the registers as small as possible, since they are pitch matched to the DRAM on a pitch of four columns, it is preferred that the register should be comprised of a cross-coupled inverter 102. To access this circuit, two pairs of NMOS field effect transistors (FETs) 104 are preferred to be used, each pair having their gates respectively connected to the RB0_ACC and RB1_ACC lines input to the 1 bit PDU, each pair having their sources connected together and to one of the respective ports of the inverter 102, one pair having their drains connected to the RB0 and RB1 leads (referred to earlier) respectively, and the other pair having their drains connected to the opposite phase RB0_ and RB1_ leads respectively of the two buses. The opposite polarity type common sources of the crosscoupled inverter are respectively connected to the PR and $PS_{13}$ leads input to the 1 bit PDU respectively.

Due to the layout of the PDU, dual port registers are used. Two buses are also used to allow all registers to be connected to the ROP4 processor. With each PDU register being dual ported, maximum flexibility is afforded to access the registers, and since all of these registers have the same design, only one register implementation need be made.

It may be seen that this register design is in many ways similar to a DRAM sense amplifier. Thus if this register is written to by overpowering the inverter 102, a great amount of power is consumed, writing to 5128 registers simultaneously. Therefore the inverters are preferred to be written to in a manner that does not overpower each bit by brute force.

To write to the crosscoupled inverters, rather than they being connected to a maximum voltage (VDD) power source and to ground (VSS), they are connected to the PR and PS_lines. Writing proceeds by equalizing the PR and PS_lines at ½ VDD, then the input data is applied to the register bus. Select line RB0_ACC or RB1_ACC is then brought to high logic level, and finally the PR and PS_lines are gently moved (without an inordinately fast rise time) to VDD and VSS respectively.

It should be noted that the NMOS access FETs cannot pass VDD, but can only pass a value VDD–Vt, where Vt is the operation threshold voltage of the FET. Either of two methods can be used to overcome this problem when reading a register.

In the first method, the register bus can be precharged to VDD before the read operation. However, the power required for this operation to bring down the appropriate side of the cross-couple to VSS on 5128 individual buses is very high, and therefore the second method to be described below is preferred.

In the second method, a power source that can supply power at a voltage of VPP is used to access the registers. VPP can be generated on-chip or off-chip, and is a voltage that is slightly more than a voltage which is Vt higher than VDD. To access the registers, when RB0_ACC and RB1_ACC are driven high, they are driven to VPP, and the resulting voltage on the RB0 or RB2 bus will be VDD. The VPP power source must be sufficiently robust to be able to drive 5128 register accesses simultaneously. To allow for this, RB0_ACC and RB1_ACC should be timed to first pull up to VDD, then have the VPP power source only pull these lines from VDD to VPP.

FIG. 10 illustrates the mask register. This register is identical with the register structure of FIG. 9, except that it contains a third port, DATA and DATA_, which connects directly to the ROP4 processor.

FIG. 11 is a block diagram of the ROP4 processor. An instruction (e.g. on input bus ROP3, which designates any of 256 logical operations on 3 inputs), is preferably implemented using an 8 to 1 multiplexer 106. The ROP3 bus is an 8 bit bus; the instruction is 8 bits which is used as the data input to the multiplexer 106. Three values from the three registers 93, 94 and 95 (carried by the SRC, SRC_, BRUSH, BRUSH_ and DEST, DEST_lines respectively to corresponding inputs to multiplexer 106) are used as select lines to the multiplexer. Mask register inputs MASK, MASK_ to a 2 to 1 multiplexer 108 to determine whether to choose the output of the multiplexer 106 (received from the OUT port of multiplexer 106) to output on the output lines OUT, OUT_of the ROP4 processor, or to write the old destination value back to itself, via the path connecting the ports labeled DEST.

FIG. 12 is a schematic diagram of an implementation of an 8 to 1 multiplexer, wherein FETs 110 in plural (8) parallel lines each of which forms a line of the ROP3 bus are connected with their source drain circuits in series, and their gates connected in accordance with the aforenoted selection scheme to the lines connected to the source, destination and brush registers. The opposite ends of the parallel lines are connected together and to the OUT port of the multiplexer. While NMOS pass transistors are preferred to be used in the implementation described above in order to keep the integrated circuit layout small, other implementations of the multiplexer can be used, such as by using standard CMOS logic or CMOS transmission gates.

FIG. 13 is a schematic diagram of an implementation of the 2 to 1 multiplexer. The gates of a pair of NMOS FETs 112A and 112B are connected to respective lines of a 2 bit bus ROP4 (corresponding to the MASK, MASK_leads of FIG. 11). The drain of FET 112A is connected to the OUT port of the 8 to 1 multiplexer 106 via the ROP3_OUT line, and the drain of the FET 112B is connected to the DEST port. The sources of FETs 112A and 112B are connected together, to output port OUT, and to the input of an inverter 114, the output of which is connected to output port OUT_.

It should be noted that since NMOS FETs pass only VDD—Vt, there is a threshold loss through the inverter 114 in the 2 to 1 multiplexer. Therefore the threshold of the inverter in the 2 to 1 multiplexer should be set to (VDD—Vt)/2. Therefore, if the OUT lead is at high logic level, it will only be at a VDD—Vt voltage. However, since the ROP4 register is of the type described above, it can easily sense the difference between this voltage and ground. Therefore a full VDD value will be restored in that register when the ROP4 controller output data is saved.

FIG. 13A is a schematic diagram of the preferred structure of the databus interface 100, the interface between the DRAM databus (DB, DB_) and the PDU register bus (RB, RB_), illustrated in FIG. 8. This circuit is similar to circuitry for bitline access to the sense amplifiers of the DRAM. Two NMOS FETs 180A, 180B, their gates enabled from the ACCESS line, allow the databus DB, DB_ to drive the register bus RB, RB_, or the register bus to drive the databus, through their source-drain circuits.

FETs 181, 182A and 182B, which have their gates connected to the EQU line and their source drain circuits access DB, DB_; VBLP, DB; and VBLP, DB_respectively, equalize the databuses to the common voltage VBLP through their source-drain circuits when a control signal appears on the EQU line. This equalization is necessary before either the sense amplifiers or the register bus writes to the databus DB, DB_, VBLP is equal to VDD/2, and allows the databus to be precharged to this midpoint voltage before the register bus writes to it. If the databus is writing to the register line then the register bus must be precharged to VDD/2, and the above-described circuitry is in the system bus interface 99 (FIG. 8).

To write to the DRAM the following sequence is followed:

i) The register bus is precharged to VBLP=VDD/2 using the system bus interface 99.

ii) One register of the PDU is enabled onto the register bus, driving it to the voltage value of the registers. Simultaneously the databus is precharged to VDD/2 using the databus interface 100.

iii) DB_ACCESS signal goes high, allowing the register bus to drive the databus. Simultaneously the addressed sense amplifier in the DRAM is precharged to VDD/2.

iv) The sense amplifier is enabled onto the databus allowing the databus to write to the sense amplifier. Simultaneously the bit lines are precharged to VDD/2.

v) The sense amplifier is enabled onto the bit lines, driving them to the voltage value of the sense amplifiers. Simultaneously a wordline goes to high logic level allowing the bit lines to write to the accessed cells.

A MEMORY READ follows the inverse sequence.

FIG. 13B is a schematic diagram of a preferred form of the system bus interface 99, SB_INT, shown in FIG. 8. It is comprised of three NMOS FETs 184, 185A and 185B which are connected to the VBLB, EQU and RB and RB_lines and which operate in a similar manner as FETs 181, 182 and 182B respectively in the circuit of FIG. 13A (with the RB and RB_bus lines substituted for the DB and DB_lines of FIG. 13A), precharging the register bus lines RB and RB_.

The circuit of FIG. 13B also includes a differential to single ended tri-state bus interface comprised of tri-state inverting buffers 188 and 189 during the respective RB and RB_lines from the SB line, buffer 188 having an inverter 190 in series with it to invert the signal on the SB input line and causing the differential outputs from buffers 188 and 189. Buffers 188 and 189 are enabled from the RW_ACC bus.

A tri-state buffer 191 connected in inverse parallel direction with buffer 189, drives the SB line from the RB_bus line, and is enabled from the RW_ACC bus_.

The above-described circuit allows the differential register bus RB, RB_to read from and write from the single ended SB bus.

FIG. 14 is a block diagram of any one of the 2 by 320 bit shift registers described with reference to FIG. 4. The shift register is comprised of two identical 320 bit shift register segments 116 connected via a control bus to a control circuit 118. Each shift register segment is preferred to be dual ported, and has a 320 bit read/write parallel port DB and DB_ connected to the DRAM via the massively parallel databus 68, and a 4-bit read/write serial port SH_DATA, SH_DATA_ for shifting data in and out, as described earlier.

The control circuit 118 predecodes two addresses for the shift registers, one for each port. Predecoded addresses are used to reduce the circuitry required for the final decoder, and also to allow a range decoder for the parallel port to be implemented.

FIG. 15 is a block diagram of a single one of the 320 bit shift registers described with reference to FIG. 14. It is comprised of ten 32 bit shift register units 120 (each a shift register), with a dedicated decoder and enable circuit 122. The databus is accessed in 32 bit blocks using either a range decode or a modified range decode, as described earlier. Therefore one 32 bit block can be accessed, all ten 32 bit blocks can be accessed, or some number of these blocks can be accessed, all in a single cycle. Since the serial port is constrained to be a 4 bit access, in this embodiment only one 32 bit shift register can be enabled by that access.

As with the PDU, there is one decoder every 128 columns. Therefore the decoder and enable circuit 122 can be laid out in the integrated circuit space between registers that exists where the wordline strap is implemented between DRAM cells.

FIG. 16 is a block diagram of a single 32 bit shift register unit used in the 320 bit shift registers described with reference to FIG. 15. It is preferably constructed of eight 4 bit registers 124 connected in series as shown, and a serial port decoder comprised of NAND gate 125 having its inputs connected to the control 118 (FIG. 14), and its output connected to the input of an inverter 126 the output of which is connected to an access port of the registers 124. Registers 124 have similar constraints on them as do the PDU registers: they are on the same pitch, they must be very small, they are dual ported and they run at the same clock rate. Therefore each of the registers is the same as those in the PDU.

FIG. 17 is a block diagram of the output path subsystem 54 illustrated in FIG. 3. This subsystem implements the well known functions of pixel formatting and control, translation of a logical pixel to a color using a look-up table, and converting the digital colors to analog values for output to the display. However, in contrast to the prior art, it is integrated into the same chip as the frame buffer, and also therefore designed in a DRAM process.

Video and graphics pixel data are received from the shift registers in the frame buffer on the GRAPHICS and VIDEO buses, four 8 bit pixels simultaneously, and are applied to graphics formatter 130 and video formatter 131. In the formatters the pixels are formatted to enable a stream of one pixel per cycle, and are re-timed. The resulting video signal is applied to the color space converter 33 where the video, which may be in a format such as YUV, is converted to RGB.

The formatted graphics data is applied from formatter 130 to a graphics color look-up table, where the logical 8 bit pixel value is converted to three 8 bit values. The output of the color space converter is applied to a video color look-up table 37. Since the video signal is already in RGB form, table 37 is used only for gamma correction of the pixel color. These look up tables are implemented as 256 by 24 bit SRAMS.

The outputs of tables 35 and 37 are applied to the input of a multiplexer 39 where one of the two graphics or video signals is chosen for output to the display, as follows.

Within the frame buffer's graphics areas a special 8 bit value indicates not a pixel color as other values indicate, but the edge of a video window. This pixel value indicates that the display should now be sent the video, rather than the graphics data. To implement this, a video key color register 141 stores the value of the special bit value, received from the system bus SYS. The graphics pixels from the output of graphics formatter 130 are applied to one of the inputs of a comparator 143; the special bit value stored in register 141 is applied to the other of the inputs of comparator 143. Comparator 143 compares the graphics data with the special bit value, and when the edge of a video window bit value from the frame buffer is detected by the comparator, it outputs a signal to an output control circuit 145. The output control signals the multiplexer 39 to switch, passing the video input signal to its output in place of the graphics input signal. The output signal is applied to multiplexer 147.

The opposite edge of the video window is detected in a similar manner as the leading edge.

Cursor definition data is stored in static random access memory (SRAM) 149, the read output of which is applied to a CURSOR input to output control 145. When the system processor detects the location that the cursor is to be placed, it enables a cursor address circuit 151 with the address CUR_ROW, and addresses the SRAM 149. From the data received from the SRAM, the output control 145 determines which of the cursor foreground color (specifying data being stored by a cursor foreground color register 153 and received from the system bus SYS), cursor background color (specifying data being stored by a cursor background color register 155 and received from the system bus SYS), graphics pixel from graphics look-up table 35, video pixel from video look-up table 37 or the inverse of the graphics or video pixel (if the cursor is in invert video mode) should be sent to the display, and applies a control signal to multiplexer 147 to control which of its inputs from the above circuits is passed through to its output.

The output data from multiplexer 147 is applied to three, 8 bit digital to analog converters 157, where the data is converted to analog red, green and blue RGB signals respectively, output at the RED, GREEN and BLUE ports respectively for application to a video monitor.

It should be noted that the power consumed by this invention should be minimized, since massive amounts of circuitry will be in operation in parallel, all of it dissipating power. For example, up to 5128 PDUs will be operating in parallel. One of the special techniques to minimize power dissipation in this invention is to use the form of registers the structure and operation as described herein. In this manner the buses have less than full VDD to VSS swing, and data can still be sensed and data stored with full logic values.

A second high power usage portion of this invention is the massively wide databuses. Up to 5128 databuses may be accessed in parallel. If a full VDD to VSS voltage swing were allowed on all these databuses, a large amount of power would be required.

FIG. 18 illustrates a circuit for minimizing the power utilized in these databuses. The circuit self times to limit the databus voltage swing to much less than full VDD.

Crosscoupled inverters 159A and 159B form transmitting and receiving sense amplifiers respectively, which are coupled to databus lead pairs DB and DB_ via access FETs 161. The power inputs are connected to the PR_T and PS_T leads respectively, and the gates of access FETs 161 are connected to the DB_SEL_T lead for the transmitting sense amplifier, and to the DB_SEL_R lead for the receiving sense amplifier, respectively. These are located in the frame buffer, along with another 639 identical sense amplifiers operating in parallel.

A dummy databus DDB, DDB_ and other circuits to be described below connected to it, are used to determine when the voltage on the real databus is split sufficiently to enable the receiving sense amplifier to read it. These other circuits are located in the memory control.

FETs 164 operate as protection diodes.

Before executing a register transfer over the databus the databus must first be precharged to a predetermined precharge voltage, such as VDD/2, by asserting the EQU signal. The real databus DB, DB_ and dummy databus DDB, DDB_ are precharged via precharge circuits 169 and 170 in a manner as described earlier. Individual register bits to which data will be transferred must also be precharged, either by enabling the DB_SEL_R control signal to allow the precharged databus to charge the register notes to the precharge voltage, or by employing individual precharge transistors in each register bit, as shown, while at the same time de-asserting the PS_R and PR_R control lines.

After disabling the databus precharge and register precharge, the transmitting sense amplifiers 159A are first enabled to dump their charge to the databus DB and DB_. The receiving sense amplifiers are equalized during this time by forcing the PR_R and PR_S leads to VDD/2 voltage. As the databus charges, the dummy databus charges in parallel, via FETs 163 accessing dummy databus DDB, DDB_ through access FETs 165. FETs 163 and 165 should be identically sized as the FETs in sense amplifier 159A and access FETs 161 respectively.

A differential amplifier 167 is connected to the dummy databus, which is sized to detect when the dummy databus (and hence the real databus) is readable. The sizing should be made such that a margin is included to cover any differences in the two databuses.

Since the dummy databus always moves in a known direction, the differential amplifier can be designed with a predetermined offset. The DDB voltage moves towards VDD while DDB_ moves towards VSS. One possible way of building in offset is to make the opposite transistors in the differential amplifier 167 equal, but make the W/L (width to length ratio) of one of the series transistors smaller than the others to build in an offset of 200 mv to 500 mv, for example.

When the differential amplifier senses a readable signal, it activates a databus OK signal on the DB_OK lead. This signal is used to disable the transmitting sense amplifiers 159A, and to enable the receiving sense amplifiers 159B.

Precharge circuit 172 can be optionally used instead of circuit 169 to precharge the sense amplifier 159, and is connected to the interface between FETs 161 and sense amplifier 159B. The precharge circuit 172 is connected to the VBLP voltage line and the EQU enable line in a manner similar to precharge circuit 169, if used.

In this manner the databus voltage is restricted from rising higher than is necessary for correct reading of its data, which will nearly always be less than VDD, resulting in saving of considerable power, and thus avoiding that dissipation.

A person understanding this invention may now conceive of alternative structures and embodiments or variations of the above. All of those which fall within the scope of the claims appended hereto are considered to be part of the present invention.

We claim:

1. A single chip display processor comprising:

(a) a dynamic random access memory (DRAM) for storing at least one of graphics and video pixel data, (b) a pixel data unit (PDU) for processing said pixel data, integrated in the same integrated circuit (IC) chip as the DRAM, (c) said IC chip further comprising a massively parallel bus for transferring blocks of pixel data at the same time from the DRAM to the PDU, whereby the PDU can process said blocks of pixel data for subsequent display of processed pixel data, (d) said DRAM comprising rows of wordlines, columns of bitlines which are orthogonal to said rows of bitlines, bit storage cells connected to said bitlines and wordlines each for storage of a bit of said pixel data, and rows of sense amplifiers connected to the bitlines, sense amplifier select lines connected to groups of said sense amplifiers for enabling operation of said groups of said sense amplifiers together, said sense amplifier and select lines being carried by said IC chip parallel to said wordlines, data bus lines constituting said massively parallel bus each being respectively connected to an output of a sense amplifier and being carried by said IC chip parallel to said bitlines, (e) the PDU being pitch matched to four bitline columns, and being comprised of single bit PDU processors, each virtually simultaneously receiving a bit from a corresponding databus for parallel processing thereof.

2. A single chip display processor comprising:

(a) a dynamic random access memory (DRAM) for storing at least one of graphics and video pixel data, (b) a pixel data unit (PDU) for processing said pixel data, integrated in the same integrated circuit (IC) chip as the DRAM, (c) said IC chip further comprising a massively parallel bus for transferring blocks of pixel data at the same time from the DRAM to the PDU, whereby the PDU can process said blocks of pixel data for subsequent display of processed pixel data, (d) said DRAM comprising rows of wordlines, columns of bitlines which are orthogonal to said rows of bitlines, bit storage cells connected to said bitlines and wordlines each for storage of a bit of said pixel data, and rows of sense amplifiers connected to the bitlines, sense amplifier select lines connected to groups of said sense amplifiers for enabling operation of said groups of said sense amplifiers together, said sense amplifier and select lines being carried by said IC chip parallel to said wordlines, data bus lines constituting said massively parallel bus each being respectively connected to an output of a sense amplifier and being carried by said IC chip parallel to said bitlines, the PDU being pitch matched to a predetermined number of bitlines columns, (e) each PDU being comprised of plural PDU units, each unit being comprised of a single bit PDU processor, each PDU processor being connected to a databus for receiving a logical bit from a sense amplifier, and (f) a PDU address decoder for enabling operation at the same time of any number of PDU processors having adjacent addresses, whereby any width of data from any adjacent bitlines may be written into said any number of PDU processors or any width of said number of PDU processors may be cleared in a single cycle.

3. A single chip display processor comprising:

(a) a dynamic random access memory (DRAM) for storing at least one of graphics and video pixel data, (b) a pixel data unit (PDU) for processing said pixel data, integrated in the same integrated circuit (IC) chip as the DRAM, (c) said IC chip further comprising a massively parallel bus for transferring blocks of pixel data at the same time from the DRAM to the PDU, whereby the PDU can process said blocks of pixel data for subsequent display of processed pixel data, (d) said DRAM comprising rows of wordlines, columns of bitlines which are orthogonal to said rows of bitlines, bit storage cells connected to said bitlines and wordlines each for storage of a bit of said pixel data, and rows of sense amplifiers connected to the bitlines, sense amplifier select lines connected to groups of said sense amplifiers for enabling operation of said groups of said sense amplifiers together, said sense amplifier and select lines being carried by said IC chip parallel to said wordlines, data bus lines constituting said massively parallel bus each being respectively connected to an output of a sense amplifier and being carried by said IC chip parallel to said bitlines, the PDUs being pitch matched to a predetermined number of bitlines columns, (e) each PDU being comprised of plural PDU units, each unit being comprised of single bit PDU processors, each PDU processor being connected to a databus for receiving a logical bit from a sense amplifier, and (f) each PDU unit being further comprised of one-bit source, destination and brush variable registers, a four input raster operation (ROP4) circuit for logically operating on bits stored in said registers, an ROP4 register for storing output data of the ROP4 circuit, and a mask register for masking output data of the PDU processors, each register being connected to the ROP4 circuit, the ROP4 circuit and each register being pitch matched to four bitline columns and connected to a databus.

4. A processor as defined in claim 3 in which each of the source, destinations and brush variable registers is comprised of a cross-coupled inverter connected to each data bus through a memory access circuit via a pair of NMOS transistors.

5. A processor as defined in claim 3 in which each of the source, destinations and brush variable registers is two ported, and is comprised of a cross-coupled inverter connected from one port to a corresponding data bus through a memory circuit via a pair of NMOS transistors, and being connected from a second port to a register bus connected to the ROP4 circuit.

6. A processor as defined in claim 5 in which each inverter is comprised of VDD voltage power and VSS ground inputs, and further including, to implement a write cycle to an inverter, means for equalizing said power and ground inputs at a voltage of ½ VDD, applying input data to one of said registers bus, selecting the register, then raising the power and ground inputs to VDD and VSS respectively.

7. A processor as defined in claim 6 including, to implement a read cycle, precharging the register bus to VDD prior to reading the register.

8. A processor as defined in claim 6 including, to implement a read cycle, applying in place of a power voltage of VDD, a VPP voltage which is greater than: an NMOS transistor operation threshold voltage which is ($V_s$) higher than VDD.

9. A single chip display processor comprising:

(a) a dynamic random access memory (DRAM) *frame buffer* for storing at least one of graphics and video pixel data, (b) a [pixel data unit (PDU) for processing said pixel data,] *graphics processor for processing in hardware said pixel data according to instructions as required by a graphical user interface or operating system,* integrated in the same integrated circuit (IC) chip as the DRAM, (c) said IC chip further comprising a massively parallel bus for transferring *in parallel* blocks of pixel data [at the same time] from the DRAM [to the PDU] *frame buffer to the graphics processor and from the graphics processor to the DRAM*, whereby the [PDU] *graphics processor* can process said blocks of pixel data for subsequent display of processed pixel data, *and write the processed pixel data into the frame buffer,*

(d) [each of] the [PDUs] *graphics processor* comprising at least one register, [each of the registers] *at least one register* being comprised of a cross-coupled inverter connected via access means to a pair of databus lines, each inverter being comprised of VDD *power* and VSS ground inputs, means for implementing a cycle accessing each inverter to the pair of data buslines by precharging the databus lines to a voltage intermediate the difference between VDD and VSS, selecting each register to connect its inverter to the pair of data bus lines, and then raising the power and ground inputs to VDD and VSS respectively.

10. A processor as defined in claim 9 in which said intermediate voltage is about VDD/2.

11. A single chip display processor comprising:

(a) a dynamic random access memory (DRAM) for storing at least one of graphics and video pixel data, (b) a pixel data unit (PDU) for processing said pixel data, integrated in the same integrated circuit (IC) chip as the DRAM, (c) said IC chip further comprising a massively parallel bus for transferring blocks of pixel data at the same time from the DRAM to the PDU, whereby the PDU can process said blocks of pixel data for subsequent display of processed pixel data, (d) said DRAM comprising rows of wordlines, columns of bitlines which are orthogonal to said rows of bitlines, bit storage cells connected to said bitlines and wordlines each for storage of a bit of said pixel data, and rows of sense amplifiers connected to the bitlines, sense amplifier select lines connected to groups of said sense amplifiers for enabling operation of said groups of said sense amplifiers together, said sense amplifier and select lines being carried by said IC chip parallel to said wordlines, data bus lines constituting said massively parallel bus each being respectively connected to an output of a sense amplifier and being carried by said IC chip parallel to said bitlines, the PDU being pitch matched to a predetermined number of bitlines columns, (e) means for temporarily storing data from the PDUs in the sense amplifiers connected to the bitlines during intervals when the DRAM is not in use, and (f) means for transferring said data from the PDU to said sense amplifiers for temporary storage via the massively parallel bus.

12. A processor as defined in claim 11, in which the DRAM memory is organized into separate buffer blocks, each block storing one bit of each pixel of an entire frame of multi-bit pixels.

13. A processor as defined in claim 12, including a system bus for carrying pixel bits from a system graphics processor for writing to each of the buffer blocks individually, and for carrying pixel bits from a system graphics processor for writing the same bit values in all of the buffer blocks in a broadcast mode.

14. A processor as defined in claim 12 including means for reading the buffer blocks in a fast page mode to provide output pixel data.

15. A processor as defined in claim 12 in which the buffer blocks are each at least 2560 columns wide by 544 rows deep in bit capacity.

16. A processor as defined in claim 12 in which the buffer blocks contain extra rows of memory for storage of at least one of scratchpad data, pixel color data, pattern data, text font data and video data.

17. A processor as defined in claim 12 in which the buffer blocks are each at least 2560 columns wide by 564 rows deep in bit capacity.

18. A processor as defined in claim 12, each buffer block comprising a DRAM and an associated PDU connected to the DRAM via said massively parallel bus, the PDU being pitch matched to the DRAM.

19. A processor as defined in claim 12, including a graphics out shift register, said shift register being pitch matched to the DRAM and being connected to the DRAM via the massively parallel bus, means for transferring data in parallel from the DRAM via said bus to the graphics out shift register and for outputting said transferred data serially for processing by display circuitry.

20. A processor as defined in claim 19 in which the shift register is comprised of a pair of shift register segments, means for transferring data corresponding to sequential groups of pixels to each of the pairs of shift register segments reciprocally in tandem whereby pixel data relating to a complete display line can be serially read out of the pairs of shift registers in sequential order.

21. A processor as defined in claim 20 including means for reading said data out of the shift register in parallel groups of bits, and means for operating the shift register in cycles at a rate which is a fraction of a pixel data rate.

22. A processor as defined in claim 20 further including a video out shift register connected to the massively parallel bus for receiving pixel data from the DRAM in parallel and for outputting the received pixel data serially for processing by display circuitry, and a video input shift register connected to the massively parallel bus for receiving serial video pixel data and for transferring it via the massively parallel bus to the DRAM.

23. A display processor as defined in claim 11, further comprising:

(g) a processor for processing at least one of said graphics and video input pixel data, (h) a random access memory digital to analog converter (RAMDAC) for receiving data processed by said processor and for converting it to a display signal, and (i) said DRAM, processor and RAMDAC being integrated into the same integrated circuit chip.

24. A processor as defined in claim 23 including a pixel data unit (PDU) for processing blocks of said pixel data, said PDU being integrated into said same integrated circuit chip.

25. A display processor as defined in claim 11, further comprising:

(g) said DRAM forming a frame buffer for storing pixel data in rows, (h) an output logic circuit for processing said pixel data, (i) said massively parallel bus having as many bus lines as pixel bits in a row interconnecting the frame buffer and output logic circuit, (j) a random access memory digital to analog converter (RAMDAC) connected to the output logic circuit for connecting data processed by the output logic circuit to a display signal, (k) said frame buffer, output logic circuit, bus and RAMDAC being integrated into the same integrated circuit chip.

26. A single chip display processor comprising:

(a) a dynamic random access memory (DRAM) for storing at least one of graphics and video pixel data, (b) a pixel data unit (PDU) for processing said pixel data, integrated in the same integrated circuit (IC) chip as the DRAM, (c) said IC chip further comprising a massively parallel bus for transferring blocks of pixel data at the same time from the DRAM to the PDU, whereby the PDU can process said blocks of pixel data for subsequent display of processed pixel data, (d) said DRAM comprising rows of wordlines, columns of bitlines which are orthogonal to said rows of bitlines, bit storage cells connected to said bitlines and wordlines each for storage of a bit of said pixel data, and rows of sense amplifiers connected to the bitlines, sense amplifier select lines connected to groups of said sense amplifiers for enabling operation of said groups of said sense amplifiers together, said sense amplifier and select lines being carried by said IC chip parallel to said wordlines, data bus lines constituting said massively parallel bus each being respectively connected to an output of a sense amplifier and being carried by said IC chip parallel to said bitlines, the PDUs being pitch matched to a predetermined number of bitlines columns, (e) each bitline column of the DRAM comprising plural transmitting and receiving sense amplifiers respectively, each connected to a bitline pair, said plural sense amplifiers being connected in parallel to an operational pair of data bus lines of an operational data bus, and further comprising a dummy data bus comprised of a dummy pair of data bus lines, means for enabling the plural transmitting sense amplifiers to dump data to the operational pair of data bus lines and for equalizing the voltage on a corresponding bitline pair to VDD/2 voltage, means for charging the dummy pair of data bus lines in parallel with the operational pair of data bus lines, means for detecting when the charge on the dummy pair of databus lines is readable and for providing a signal for disabling the transmitting sense amplifiers and enabling the receiving sense amplifiers, whereby the voltage on the operational pair of data bus lines is inhibited from rising to a level higher than is necessary for correct reading of its data.

* * * * *